United States Patent
Sadiq et al.

(10) Patent No.: US 10,447,517 B2
(45) Date of Patent: Oct. 15, 2019

(54) METHODS AND APPARATUS FOR USING SYNCHRONIZATION SIGNALS AS REFERENCE FOR DEMODULATING MULTI-PORT BROADCAST CHANNEL

(71) Applicant: QUALCOMM Incorporated, San Diego, CA (US)

(72) Inventors: Bilal Sadiq, Basking Ridge, NJ (US); Navid Abedini, Raritan, NJ (US); Juergen Cezanne, Ocean Township, NJ (US); Sundar Subramanian, Bridgewater, NJ (US); Tao Luo, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/594,408

(22) Filed: May 12, 2017

(65) Prior Publication Data

US 2018/0091341 A1     Mar. 29, 2018

Related U.S. Application Data

(60) Provisional application No. 62/400,533, filed on Sep. 27, 2016.

(51) Int. Cl.
*H04L 27/233* (2006.01)
*H04B 7/08* (2006.01)
(Continued)

(52) U.S. Cl.
CPC ...... *H04L 27/2331* (2013.01); *H03M 13/356* (2013.01); *H04B 1/69* (2013.01);
(Continued)

(58) Field of Classification Search
CPC . H04L 27/2331; H04L 5/0048; H04L 5/0053; H04L 5/0008; H04L 27/2631;
(Continued)

(56) References Cited

U.S. PATENT DOCUMENTS

2011/0293037 A1* 12/2011 Liu ................... H04L 5/001
375/295
2014/0086173 A1   3/2014 Sadeghi et al.
(Continued)

OTHER PUBLICATIONS

Intel Corporation: "NB-IoT Secondary Synchronization Signal Design", 3GPP Draft; R1-162976, 3rd Generation Partnership Project (3GPP), Mobile Competence Centre; 650, Route Des Lucioles; F-06921 Sophia-Antipolis Cedex; France, vol. RAN WG1, No. Busan, Korea; Apr. 11, 2016-Apr. 15, 2016 Apr. 6, 2016, XP051080735, Retrieved from the Internet: URL:http://www.3gpp.org/ftp/tsg_ran/WG1_RL1/TSGR1_84b/Docs/ [retrieved on Apr. 6, 2016], 7 pages.
(Continued)

*Primary Examiner* — Feben Haile
(74) *Attorney, Agent, or Firm* — Arent Fox, LLP; Clint R. Morin

(57) ABSTRACT

Various features related to using a multi-port synchronization signal as reference for demodulating a multi-port broadcast channel are described. In an aspect, a synchronization signal, e.g., SSS, may be repurposed to serve as a demodulation reference for a downlink channel, e.g., PBCH, thereby obviating the need for a base station to send an additional reference signal for PBCH demodulation. A base station may select two or more logical antenna ports to transmit a synchronization signal, transmit the synchronization signal from the selected two or more logical antenna ports, and transmit information on the PBCH, from at least the selected two or more logical antenna ports. A UE may receive the synchronization signal from the two or more logical antenna ports at the base station, receive information on the PBCH
(Continued)

from the at least the two or more logical antenna ports, and demodulate the information based on the received synchronization signal.

24 Claims, 11 Drawing Sheets

(51) Int. Cl.
*H04L 27/26* (2006.01)
*H04B 1/69* (2011.01)
*H04L 5/00* (2006.01)
*H04H 60/11* (2008.01)
*H03M 13/35* (2006.01)

(52) U.S. Cl.
CPC ........... *H04B 7/0854* (2013.01); *H04H 60/11* (2013.01); *H04L 5/0008* (2013.01); *H04L 5/0023* (2013.01); *H04L 5/0048* (2013.01); *H04L 5/0053* (2013.01); *H04L 27/2631* (2013.01); *H04L 27/2649* (2013.01)

(58) Field of Classification Search
CPC . H04L 5/0023; H04L 27/2649; H04L 27/263; H04B 1/69; H04B 7/0854
See application file for complete search history.

(56) References Cited

U.S. PATENT DOCUMENTS

| 2014/0086285 A1* | 3/2014 | Yang | H04B 7/0691 |
| | | | 375/219 |
| 2016/0119901 A1* | 4/2016 | Zhang | H04L 5/0048 |
| | | | 370/329 |
| 2017/0195942 A1* | 7/2017 | Zhao | H04W 48/12 |
| 2017/0359791 A1* | 12/2017 | Onggosanusi | H04L 5/0023 |

OTHER PUBLICATIONS

International Search Report and Written Opinion—PCT/US2017/049181—ISA/EPO—dated Nov. 9, 2017.
LG Electronics: "Overview on Design of Downlink for NB-IoT", 3GPP Draft; R1-155799, 3rd Generation Partnership Project (3GPP), Mobile Competence Centre; 650, Route Des Lucioles; F-06921 Sophia-Antipolis Cedex; France, vol. RAN WG1, No. Malmo, Sweden; Oct. 4, 2015, XP051002602, Retrieved from the Internet: URL:http://www.3gpp.org/ftp/Meetings_3GPP_SYNC/RAN1/Docs/ [retrieved on Oct. 4, 2015], 6 pages.
Samsung: "Overview on Issues for NR Initial Access", 3GPP Draft; R1-166796, 3rd Generation Partnership Project (3GPP), Mobile Competence Centre; 650, Route Des Lucioles; F-06921 Sophia-Antipolis Cedex; France, vol. RAN WG1, No. Gothenburg, Sweden; Aug. 21, 2016, XP051140393, Retrieved from the Internet: URL:http://www.3gpp.org/ftp/Meetings_3GPP_SYNC/RAN1/Docs/ [retrieved on Aug. 21, 2016], 4 pages.

\* cited by examiner

METHODS AND APPARATUS FOR USING SYNCHRONIZATION SIGNALS AS REFERENCE FOR DEMODULATING MULTI-PORT BROADCAST CHANNEL

CROSS-REFERENCE TO RELATED APPLICATION(S)

This application claims the benefit of U.S. Provisional Application Ser. No. 62/400,533, entitled "METHODS AND APPARATUS FOR USING SYNCHRONIZATION SIGNALS AS REFERENCE FOR DEMODULATING MULTI-PORT BROADCAST CHANNEL" filed on Sep. 27, 2016, which is expressly incorporated by reference herein in its entirety.

BACKGROUND

Field

The present disclosure relates generally to communication systems, and more particularly, to methods and apparatus for using synchronization signals as reference for demodulating a broadcast channel.

Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is Long Term Evolution (LTE). LTE is a set of enhancements to the Universal Mobile Telecommunications System (UMTS) mobile standard promulgated by Third Generation Partnership Project (3GPP). LTE is designed to support mobile broadband access through improved spectral efficiency, lowered costs, and improved services using OFDMA on the downlink, SC-FDMA on the uplink, and multiple-input multiple-output (MIMO) antenna technology. However, as the demand for mobile broadband access continues to increase, there exists a need for further improvements in LTE technology. These improvements may also be applicable to other multi-access technologies and the telecommunication standards that employ these technologies.

Cellular systems typically employ periodic or frequent transmission of synchronization signals and broadcast channels, such as the primary synchronization signal (PSS), secondary synchronization signal (SSS), and Physical Broadcast Channel (PBCH) in LTE. In addition, a base station is typically also required to transmit separate reference signals, such as a cell-specific reference signal, (CRS) to allow for PBCH demodulation by devices in the system.

It would be desirable if methods and apparatus can be developed that would allow devices in the system to be able to demodulate one or more channels without the need for the base station to send separate additional reference signals for the purposes of channel demodulation.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Cellular systems generally employ periodic or frequent transmission of synchronization signals and broadcast channels, such as the PSS, SSS, and PBCH in LTE. The synchronization signals allow the system devices, e.g., UEs, to attain time and frequency synchronization and acquire useful system parameters such as cell identity, cyclic prefix length, and access mode (FDD/TDD). Via the PBCH a base station broadcasts a number of parameters needed for initial access of the cell, such as downlink system bandwidth, the physical hybrid automatic repeat request (ARQ) indicator channel structure, system frame number, etc. The information broadcast on the PBCH is modulated and a device that intends to use the information communicated on the PBCH needs to demodulate the information first for the information to be actually meaningful. Thus, in addition to the above, a base station also transmits a separate reference signal, such as a CRS for demodulation of the information transmitted on the downlink broadcast channel, e.g., PBCH, to allow the system devices to demodulate and decode the information on the broadcast channel.

While the reference signals are used by the devices in the system to accurately demodulate the information transmitted on the broadcast channel, from the perspective of the base station, and the overall system at large, the additional reference signal transmissions add to the signaling overhead and use valuable spectrum resources which may otherwise be used by devices for communicating other information such as actual user data.

Various configurations and features for using multi-port synchronization signals as a reference for demodulating multi-port broadcast channels are described. In accordance with one aspect, a synchronization signal such as an SSS may be repurposed to serve as a demodulation reference for downlink physical channels, e.g., for PBCH. Thus, in accordance with one aspect, in some configurations the base station may not need to send additional reference signals for PBCH demodulation and the system devices, e.g., UEs, may demodulate the PBCH transmissions based on a synchronization signal, e.g., SSS, transmitted by the base station. Furthermore, in some aspects the base station may convey, via the PBCH, an indication of a transmit power of a synchronization signal, e.g., SSS, transmitted by the base station. The system devices may use the synchronization signal, e.g., SSS, to determine a pathloss to the base station and a transmit power for uplink transmissions such as random access channel (RACH) transmissions, uplink data transmissions, uplink control transmissions, etc.

In an aspect of the disclosure, a method, a computer-readable medium, and an apparatus are provided. The apparatus, e.g., a base station, may be configured to select two or more logical antenna ports to transmit a synchronization signal, transmit the synchronization signal from the selected two or more logical antenna ports, and transmit information on a downlink physical channel from at least the selected two or more logical antenna ports.

In another aspect of the disclosure, a method, computer-readable medium, and an apparatus are provided. The apparatus, e.g., a UE, may be configured to receive a synchronization signal from two or more logical antenna ports at a base station, receive information on a downlink physical channel from at least the two or more logical antenna ports, and demodulate the information received on the downlink physical channel based on the received synchronization signal. In some configurations, the received synchronization signal is a SSS and the downlink physical channel is a PBCH. In some configurations, demodulating the information received on the downlink physical channel includes estimating a channel for each of the two or more logical antenna ports using the received SSS as a reference signal and using the channel estimates to demodulate the information received on the downlink physical channel.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
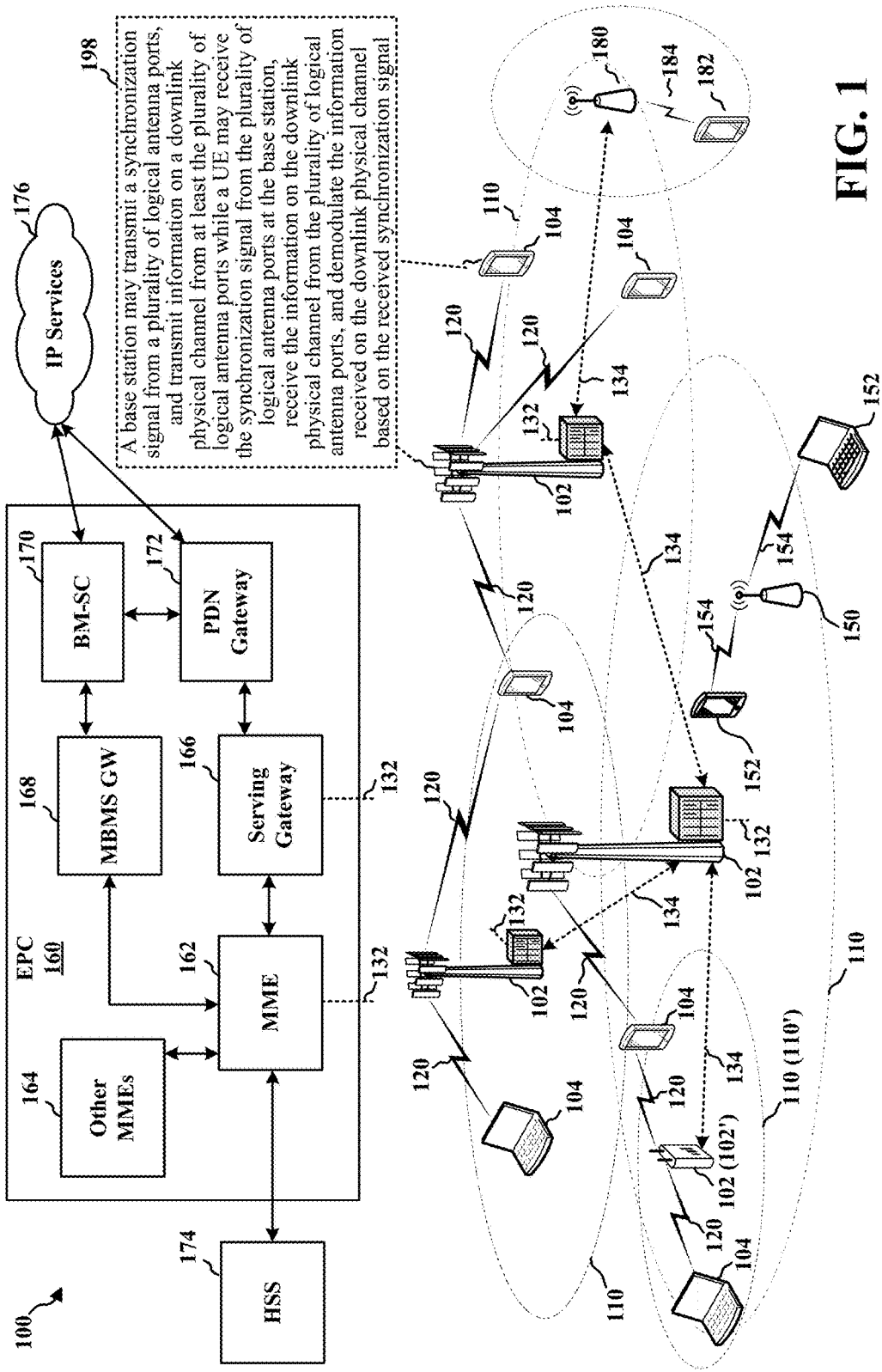
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include eNBs. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use MIMO antenna technology, including spatial multiplexing, beamforming, and/or transmit diversity. The communication links may be through one or more carriers. The base stations 102/UEs 104 may use spectrum up to Y MHz (e.g., 5, 10, 15, 20 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ LTE and use the same 5 GHz unlicensed frequency spectrum as used by the Wi-Fi AP 150. The small cell 102', employing LTE in an unlicensed frequency spectrum, may boost coverage to and/or increase capacity of the access network. LTE in an unlicensed spectrum may be referred to as LTE-unlicensed (LTE-U), licensed assisted access (LAA), or MuLTEfire.

The millimeter wave (mmW) base station 180 may operate in mmW frequencies and/or near mmW frequencies in communication with the UE 182. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 182 to compensate for the extremely high path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, or any other similar functioning device. The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, a base station, e.g., eNB 102, may be configured to transmit a synchronization signal from a selected plurality, e.g., two or more, logical antenna ports, and transmit information on a downlink physical channel from at least the selected two or more logical antenna ports, while a mobile device such as UE 104 may be configured to receive the synchronization signal transmitted from the two or more logical antenna ports at the base station, receive information on a downlink physical channel via at least the two or more logical antenna ports, and demodulate the information received on the downlink physical channel based on the received synchronization signal (198).

Figures 2A, 2B, 2C, 2D:
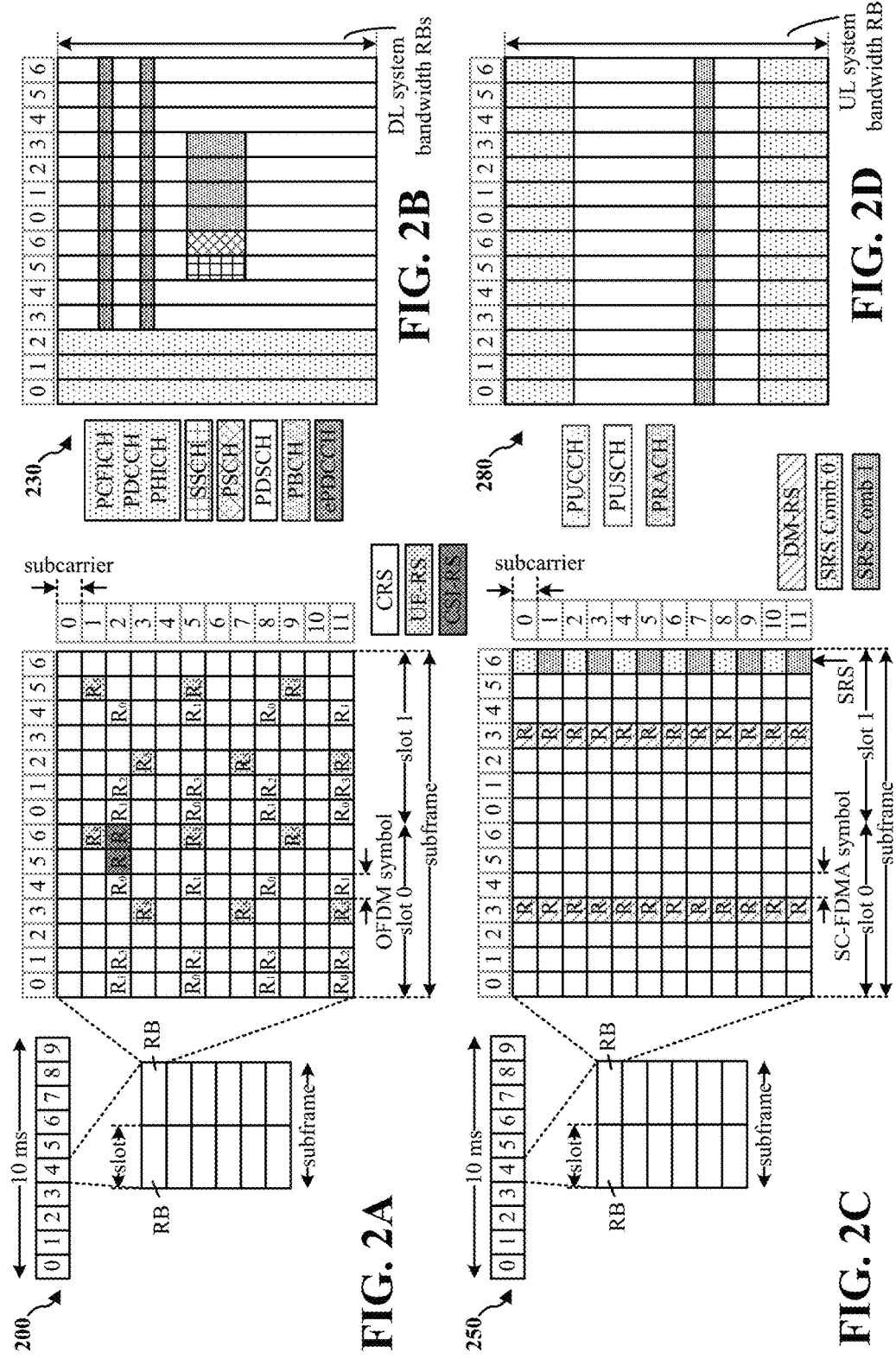
FIGS. 2A, 2B, 2C, and 2D are diagrams illustrating LTE examples of a DL frame structure, DL channels within the DL frame structure, an UL frame structure, and UL channels within the UL frame structure, respectively.

FIG. 2A is a diagram 200 illustrating an example of a DL frame structure in LTE. FIG. 2B is a diagram 230 illustrating an example of channels within the DL frame structure in LTE. FIG. 2C is a diagram 250 illustrating an example of an UL frame structure in LTE. FIG. 2D is a diagram 280 illustrating an example of channels within the UL frame structure in LTE. Other wireless communication technologies may have a different frame structure and/or different channels. In LTE, a frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). In LTE, for a normal cyclic prefix, an RB contains 12 consecutive subcarriers in the frequency domain and 7 consecutive symbols (for DL, OFDM symbols; for UL, SC-FDMA symbols) in the time domain, for a total of 84 REs. For an extended cyclic prefix, an RB contains 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as $R_0$, $R_1$, $R_2$, and $R_3$, respectively), UE-RS for antenna port 5 (indicated as $R_5$), and CSI-RS for antenna port 15 (indicated as R). FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARM) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) is within symbol 6 of slot 0 within subframes 0 and 5 of a frame, and carries a primary synchronization signal (PSS) that is used by a UE to determine subframe timing and a physical layer identity. The secondary synchronization channel (SSCH) is within symbol 5 of slot 0 within subframes 0 and 5 of a frame, and carries a secondary synchronization signal (SSS) that is used by a UE to determine a physical layer cell identity group number. Based on the physical layer identity and the physical layer cell identity group number, the UE can determine a physical cell identifier (PCI). Based on the PCI, the UE can determine the locations of the aforementioned DL-RS. The PBCH is within symbols 0, 1, 2, 3 of slot 1 of subframe 0 of a frame, and carries a master information block (MIB). The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the eNB. The UE may additionally transmit sounding reference signals (SRS) in the last symbol of a subframe. The SRS may have a comb structure, and a UE may transmit SRS on one of the combs. The SRS may be used by an eNB for channel quality estimation to enable frequency-dependent scheduling on the UL. FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
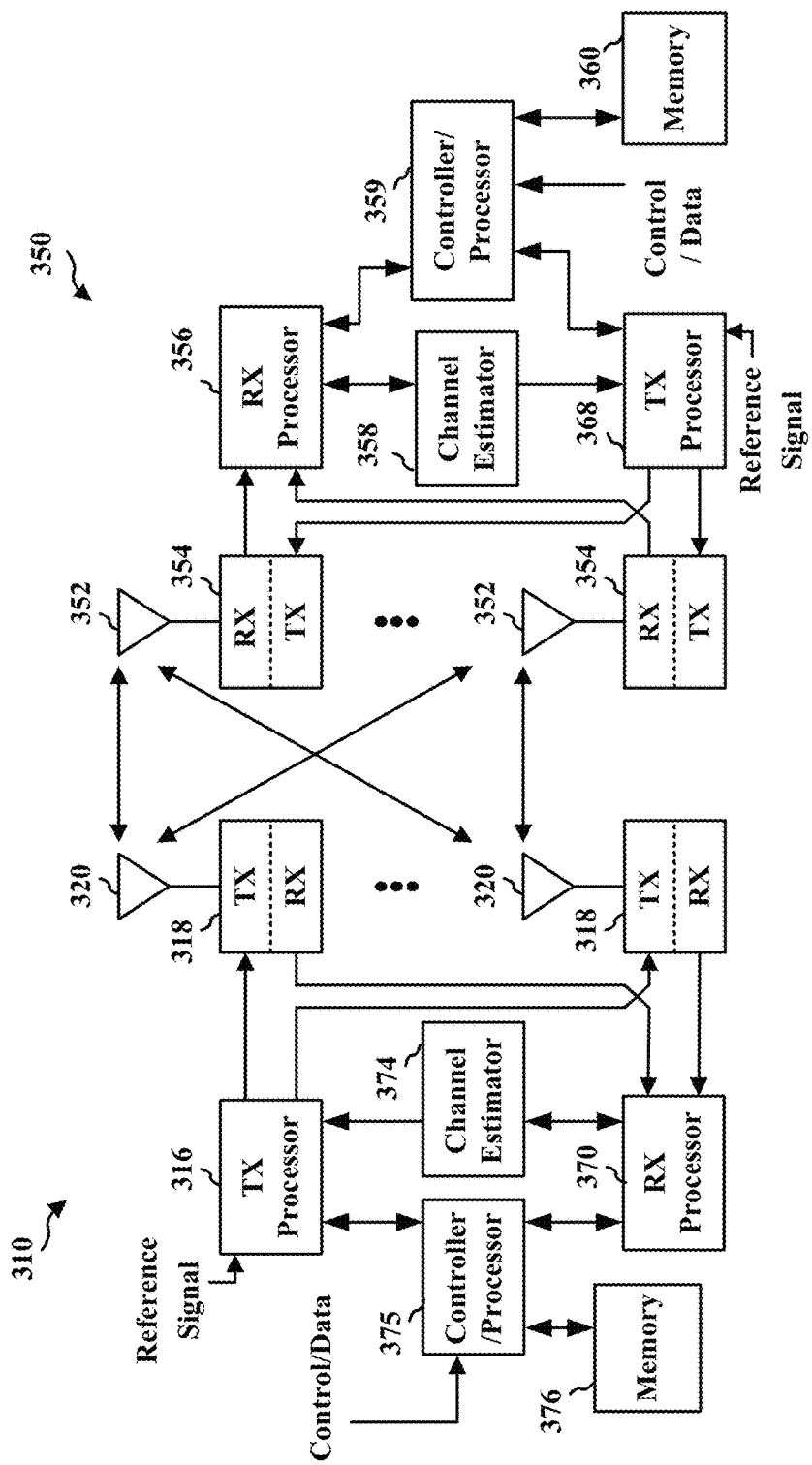
FIG. 3 is a diagram illustrating an example of an evolved Node B (eNB) and user equipment (UE) in an access network.

FIG. 3 is a block diagram of an eNB 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the eNB 310. These soft decisions may be based on channel estimates computed by the channel estimator 358. The soft decisions are then decoded and deinterleaved to recover the data and control signals that were originally transmitted by the eNB 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the eNB 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the eNB 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the eNB 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

A UE device that wishes to access an LTE communication system follows a cell search procedure which may include a number of synchronization stages by which the UE determines time and frequency parameters needed to function and operate in the system, for example to demodulate downlink signals, to transmit with correct timing and to acquire system parameters. Thus cellular systems typically employ periodic or frequent transmission of synchronization signals such as the PSS and the SSS, and broadcast channels such as the PBCH in LTE. In some configurations, synchronization signals may be transmitted twice per 10 ms radio frame.

The detection of the synchronization signals allows the UE to complete time and frequency synchronization and to acquire useful system parameters such as cell identity, cyclic prefix length, and access mode (FDD/TDD). Via the PBCH the base station broadcasts a number of parameters needed for initial access of the cell, such as downlink system bandwidth, the Physical Hybrid ARQ Indicator Channel structure, and the most significant eight-bits of the System Frame Number. The parameters may be carried in a Master Information Block. However, the information broadcast on the PBCH is modulated and a UE receiving the PBCH would need to demodulate the information for the information to be used in a meaningful manner.

To allow for coherent demodulation at the UE, reference signal (e.g., pilot signals) are transmitted by the base station. The reference/pilot symbols are inserted in the OFDM time-frequency grid to allow for channel estimation by the UE. Therefore in addition to frequent transmission of synchronization signals, a base station is typically also required to transmit separate reference signals, such as a CRS, for PBCH demodulation. Based on the reference signals the UE may decode the PBCH and gain system information, e.g., parameters. As can be appreciated, the requirement to transmit additional reference signals to allow demodulation of the PBCH adds additional overhead and bandwidth usage.

Figure 4:
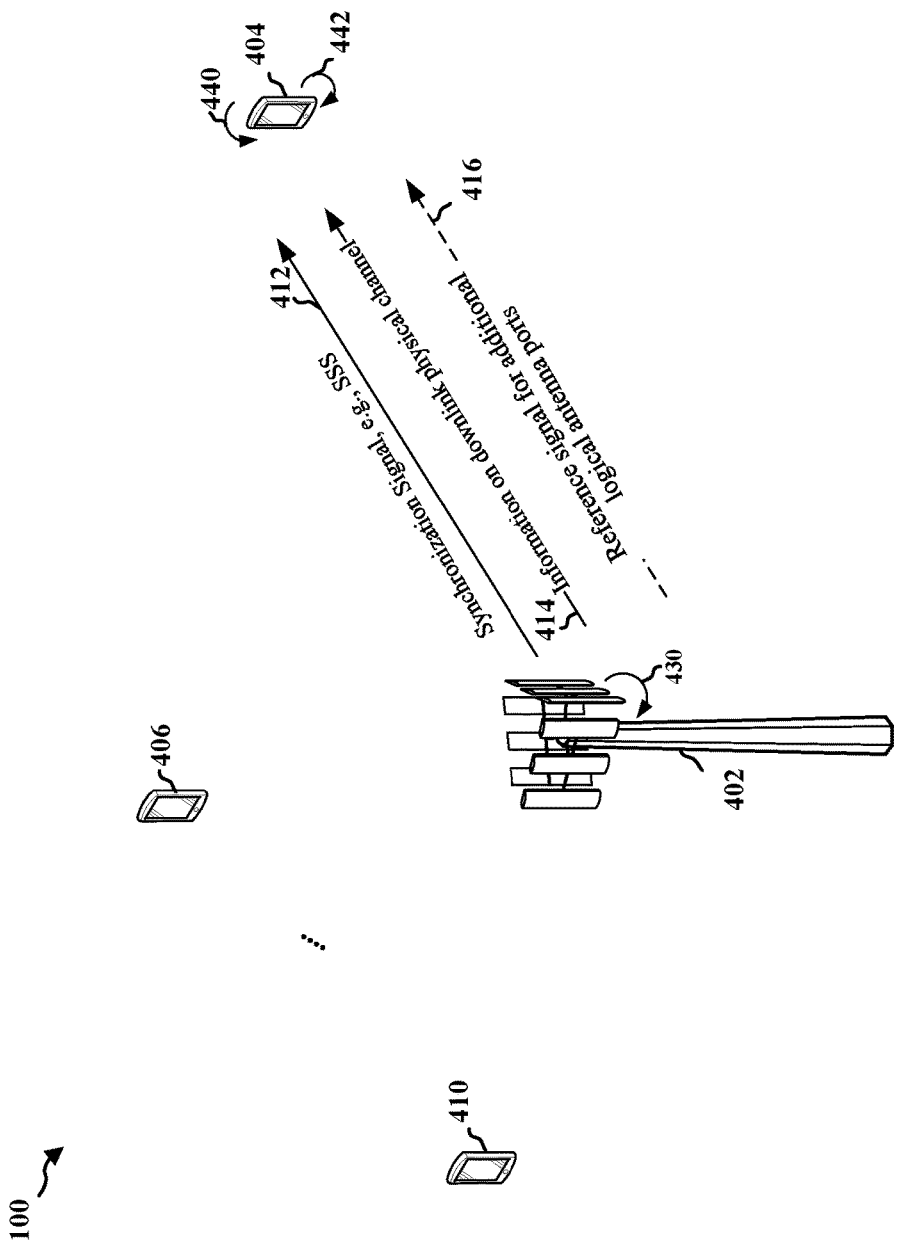
FIG. 4 illustrates an exemplary communications system and downlink signaling in accordance with an exemplary configuration.

FIG. 4 illustrates an exemplary communications system 400 and exemplary downlink signaling used in the system in accordance with an exemplary embodiment. The exemplary communications system 400 may be a part of the system and access network of FIG. 1. The communications system 400 includes a base station (e.g., eNB) 402 and a plurality of UEs including UE 404, UE 406, . . . , and UE 410. The base station 402 may be the base station 102 and the UEs 404, 406, . . . , 410 may be implemented as UE 104 of FIG. 1.

In accordance with one aspect of the methods proposed herein, the synchronization signals transmitted by the base station 402 also serve as the demodulation reference signals for the UEs 404, 406, . . . , 410 and thus the UEs 404, 406, . . . , 410 may demodulate the downlink channels, e.g., such as the PBCH, using the received synchronization signals without the need for additional reference/pilot signals to be transmitted by the base station 402. Various aspects related to the exemplary methods which may be used in the communications system 400 are discussed below.

In an aspect, the base station 402 of FIG. 4, may select two or more logical antenna ports for transmission of a synchronization signal 412. The synchronization signal 412 may be a SSS in some embodiments. The logical antenna ports are not physical antennas, but rather are logical entities distinguished by the reference signal sequences transmitted by the logical antenna ports. Multiple antenna port signals may be transmitted on a single transmit antenna and a single antenna port may be spread across multiple transmit antennas. A logical antenna port may include one or more physical antenna ports. For example the base station 402 may have 8 physical antennas, e.g., A1, A2, A3, A4, A5, A6, A7, A8. In one configuration, physical antennas A1, A3, A4 may form a first logical antenna port, e.g., logical antenna port 1, and antennas A2, A5, A6 may form a second logical antenna port, e.g., logical antenna port 2. The way in which the logical antenna ports are assigned to the physical transmit antennas of the base station 402 may be up to the base station 402, and may vary between base stations.

For discussion purposes consider that the synchronization signal 412 is the SSS. The SSS 412 may include a sequence of complex symbols. Having selected the logical antenna ports for transmission of the SSS, the base station 402 may map the complex symbols of the SSS 412 to two or more layers. In one configuration the mapping includes the base station 402 assigning each complex symbol in the sequence to the two or more layers. After layer mapping, e.g., mapping the sequence to the two or more layers, precoding may be performed by a precoding component of the base station 402 on the mapped sequence on the two layers. The operation of layer mapping and precoding at the base station is indicated by the curved arrow 430 in FIG. 4. The output of the precoding may be then assigned to the selected two or more logical antenna ports for transmission. The process of mapping is discussed in further detail with regard to FIG. 5. However, in the case where 2 logical antenna ports are used for SSS transmission, the sequence for transmission from one logical antenna port may be orthogonal to the other, either in the time/frequency domain or in the code domain which may be accomplished in the precoding phase as will be discussed below with regard to FIG. 5. The base station 402 may transmit the synchronization signal 412 from the selected logical antenna ports and the information on a downlink physical channel from at least the same logical antenna ports. As illustrated in FIG. 4, the base station 402 may transmit the synchronization signal 412 to UE 404 from the two or more selected logical antenna ports. Furthermore the base station 402 may transmit information on a downlink physical channel (414) from at least the selected two or more logical antenna ports. In some configurations, the synchronization signal 412 may be the SSS and the downlink physical channel (414) may be the PBCH. In some other configuration the downlink physical channel may be one of the PBCH, a physical downlink shared channel (PDSCH) or a physical multicast channel (PMCH). The information transmitted on the downlink physical channel, e.g., PBCH, may include one or more parameters for use by UEs 404, 406, . . . , 410 in initial access of a cell such as, e.g., downlink system bandwidth, the Physical Hybrid ARQ Indicator Channel structure, and bits of the System Frame Number.

In some configurations, information on the downlink physical channel, e.g., PBCH, may be transmitted from additional logical antenna port(s) of the base station 402 which may be different from the selected two or more antenna ports from which the synchronization signal 412 is transmitted. In some such configurations, an additional reference signal 416 (optional) may be transmitted from the base station 402 to provide a reference signal to the UE 404 for the transmission from the additional logical antenna port(s) to allow the UE 404 to perform channel estimation (for a channel between the additional transmission antenna port(s) of base station 402 and the receiving UE 404) to demodulate the information on the PBCH. While not shown in FIG. 4, in some configurations, the base station 402 may transmit a PSS from one of the logical antenna ports of the selected two or more logical antenna ports.

In some configurations, the UE 404 may receive the synchronization signal 412 transmitted from the two or more logical antenna ports at the base station 402 and may receive the information transmitted on the downlink physical channel by the base station 402 on the at least the two or more logical antenna ports of the base station 402. The UE 404 (and other UEs of the system) may be aware that the UE may use the synchronization signal 412 to demodulate the broadcast channel information using, as a reference signal, the synchronization signal transmitted by the base station on the two or more logical antenna ports. The UE 404 may be preconfigured with the information indicating reference signal(s) to use for demodulating downlink broadcast channel information and thus knows what reference signal to use for demodulating the information transmitted on the broadcast channel. Thus in some configurations, the UE 404 may be configured to demodulate the information on the downlink physical channel based on the received synchronization signal 412, e.g., an SSS. In some configurations, the UE 404 may be configured to generate (curved arrow 440) channel estimates for each logical antenna port of the two or more logical antenna ports using the received synchronization signal 412. In some configurations, the UE 404 may be further configured to demodulate (curved arrow 442) the information on the downlink physical channel using the generated channel estimates. In some configurations, the UE 404 may be further configured to receive a PSS from the base station 402, transmitted by the base station on a logical antenna port, and demodulate the information on the downlink physical channel further based on the PSS. Thus in some embodiments the UEs of the system may be configured to demodulate downlink physical channel information based on one or more synchronization signals transmitted from two or more logical antenna ports at the base station 402. The synchronization signals may be the SSS and/or PSS, transmitted from the same two or more logical antenna ports. In some configurations, the UE 404 may be further configured to demodulate the information received on the downlink physical channel further based on the received additional reference signal 416.

Figure 5:
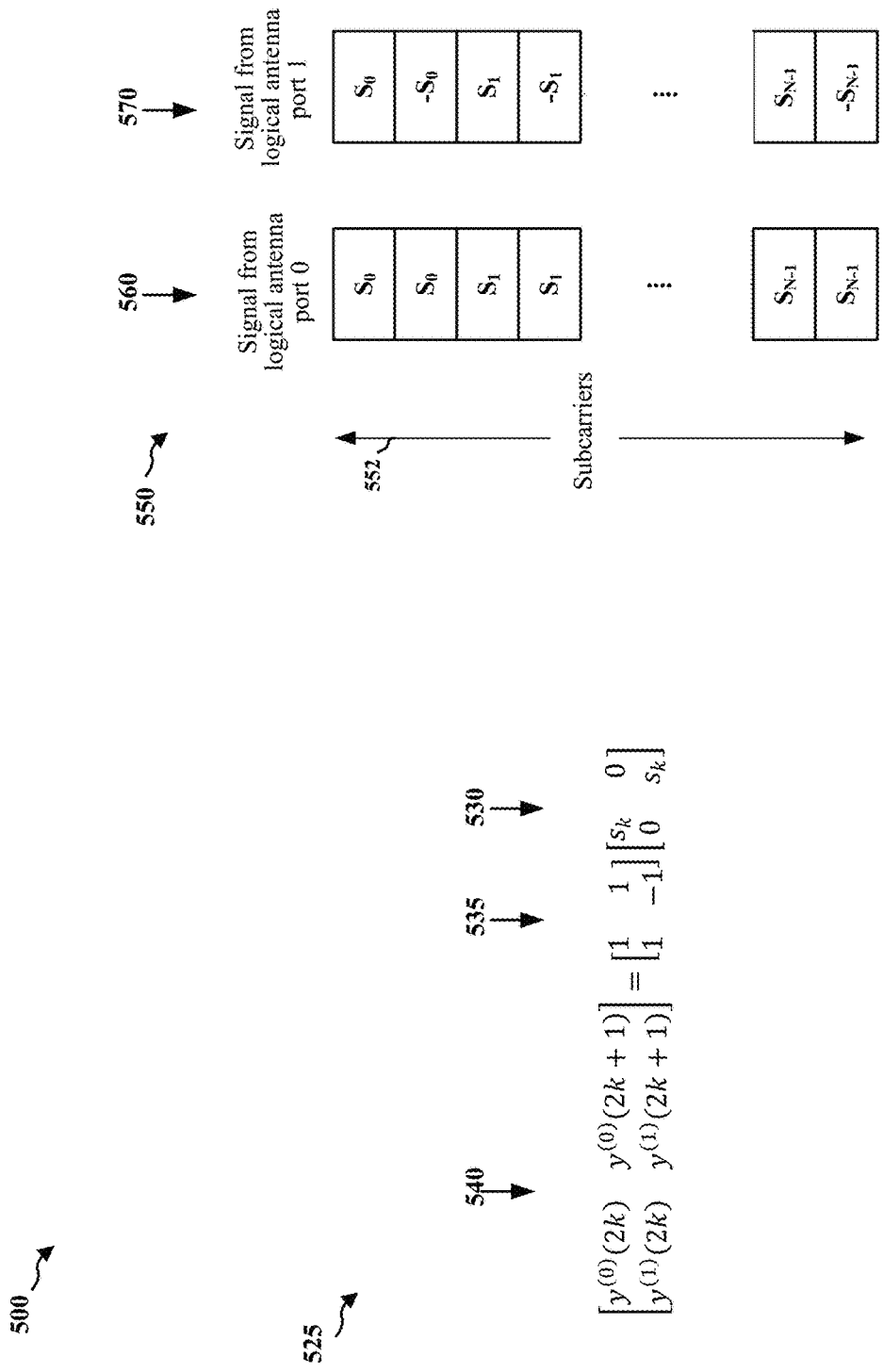
FIG. 5 is a drawing illustrating an example of layer mapping and precoding for an exemplary synchronization signal in accordance with one configuration.

FIG. 5 is a drawing 500 illustrating an example of layer mapping and precoding for an exemplary synchronization signal, e.g., synchronization signal 412, in accordance with an exemplary embodiment and includes two diagrams 525 and 550. For discussion purposes, consider that the synchronization signal 412 is a SSS and that the base station 402 transmits the SSS from two logical antenna ports. In some configurations, the SSS is a sequence of complex symbols (modulation symbols) which may be expressed as:

$$S=\{S_0, S_1, S_2, \ldots, S_{N-1}\}. \qquad (1)$$

where N is the number of the complex symbols and $S_0$, $S_1$, $S_2$, ..., $S_{N-1}$ each being a complex number in the sequence. In the illustrated example where the SSS sequence includes N complex symbols, 2N number of resource elements (in the frequency domain) may be used to carry the SSS and an exemplary 2 layer mapping and precoding operation is shown by the matrix equation illustrated in diagram 525 for k=0, 1, 2, . . . , N−1. Starting from right to left, the first matrix 530 on the right most side of the matrix equation may be referred to as the layer mapping component (e.g., used for the layer mapping operation) of the equation or layer matrix 530 which maps the symbols of the SSS sequence to two layers in the example, e.g., assigning each complex symbol in the sequence to two layers. The layer mapping operation maps the complex symbols to layers. The layer mapping operation may provide transmit diversity or spatial multiplexing as desired. The matrix 535 represents a precoding operation and may be referred to as a precoding component of the equation or the precoding matrix 535 which is used to precode the two layers onto which the complex symbols of the sequence are mapped. Thus an input to the precoder are the layer mapped sequence of the complex symbols, e.g., with precoding being applied to the complex symbols in each layer. The precoding of the two layers may produce two precoded streams of complex symbols which may then be assigned to two selected logical antenna ports, one stream assigned to each selected logical antenna port. In the particular example of 2 antenna ports and 2 layers, each antenna port may carry a combination of the complex symbols from the two layers. In multiple antenna port-multiple layer cases, each antenna port may carry a combination of the symbols from multiple layers. Thus the result of precoding is a set of symbols that may be mapped directly onto the subcarriers (e.g., resource elements) for transmission via the 2 antenna ports. The precoding operation may include multiplying the layer matrix 530 with the precoding matrix 535 to generate the antenna port subcarrier values that may be sent to the logical antenna ports for transmission. The matrix 540 on the left hand side includes the symbols transmitted from the selected two logical antenna ports at given resource elements, e.g., tones of OFDM symbols.

In the matrix equation shown in diagram 525 for a 2 layer-2 logical antenna port transmission example, k is a dummy variable and $y^{(0)}(2K)$ denotes the symbol transmitted from logical antenna port "0" on subcarrier index 2k, $y^{(0)}(2k+1)$ denotes the symbol transmitted from logical antenna port "0" on subcarrier index 2k+1, $y^{(1)}(2k)$ denotes the symbol transmitted from logical antenna port "1" on subcarrier index 2k and $y^{(1)}(2k+1)$ denotes the symbol transmitted from logical antenna port "1" on subcarrier index 2k+1. Thus, in general a symbol transmitted from logical antenna port "p" at resource element index "l" may be denoted as $y^{(p)}(l)$.

Diagram 550 illustrates an example of precoded streams of complex symbols assigned to two logical antenna ports for transmission, with frequency being indicated on the Y-axis 552. Each individual box (in columns 560, 570) along the Y-axis 552 represents a single subcarrier, e.g., tone, that carries a symbol of the SSS sequence. In the illustrated example, the two logical antenna ports include logical antenna port 0 and logical antenna port 1 corresponding to columns 560 and 570, respectively. The first column 560 shows the first precoded stream of complex symbols assigned to logical antenna port 0 for transmission while the second column 570 shows the second precoded stream of complex symbols assigned to logical antenna port 1 of the two selected logical antenna ports. In one configuration, the logical antenna port 0 may map to a set of even physical antenna ports which may transmit the stream in the column 560 and the logical antenna port 1 may map to a set of odd physical antenna ports which may transmit the stream in the column 570. The two precoded streams may be orthogonal in terms of code and thus the two antenna transmissions are separated in code space even though a same set of tones may be used to transmit the symbols in some embodiments. In accordance with one aspect, the base station transmits information on a physical downlink channel, e.g., such as the PBCH, from at least the same two logical antenna ports (e.g., logical antenna ports 0 and 1 in the FIG. 5 example) from which the SSS was transmitted thereby enabling a UE receiving the transmissions to demodulate the PBCH information using the SSS as a reference signal.

The exemplary layer mapping and precoding scheme discussed above may obviate the need for blind decoding by the UE because the resource element mapping is not dependent on the number of actual antenna ports. Otherwise, without such a layer mapping and precoding scheme, blind decoding at the UE may be needed since resource element mapping and cell-specific reference signals may be different for different numbers of antenna ports.

While one example of an SSS sequence is shown by equation (1), many variations are possible. In some embodiments the sequence of complex symbols of the SSS may be generated by modulating an SSS bit sequence. In some embodiments the sequence of complex symbols of the SSS may be based on a Zadoff-chu (ZC) sequence. In some such embodiments, a root index of the ZC sequence may be a function of at least one of: i) a primary synchronization signal ZC root index, ii) Cell identity (ID) or virtual Cell ID, or iii) periodicity of signal transmissions by the base station. The periodicity of transmission of signals may include periodicity of a beam sweep of the transmission of synchronization signals including the SSS and a PSS, or periodicity of a beam sweep of transmission of information on the PBCH. In some embodiments, the sequence of complex symbols of the SSS may be a Zadoff-chu sequence cyclic shifted by a value. In some such embodiments the cyclic shift value, e.g., a selected/chosen cyclic shift value, may be a function of at least one of: i) a PSS ZC root index, ii) a Cell ID or a virtual Cell ID, iii) a periodicity of transmission of signals, or iv) a time of transmission of signals. The time of transmission of signals may be based on an OFDM symbol index, a slot number or a subframe number.

Figure 6:
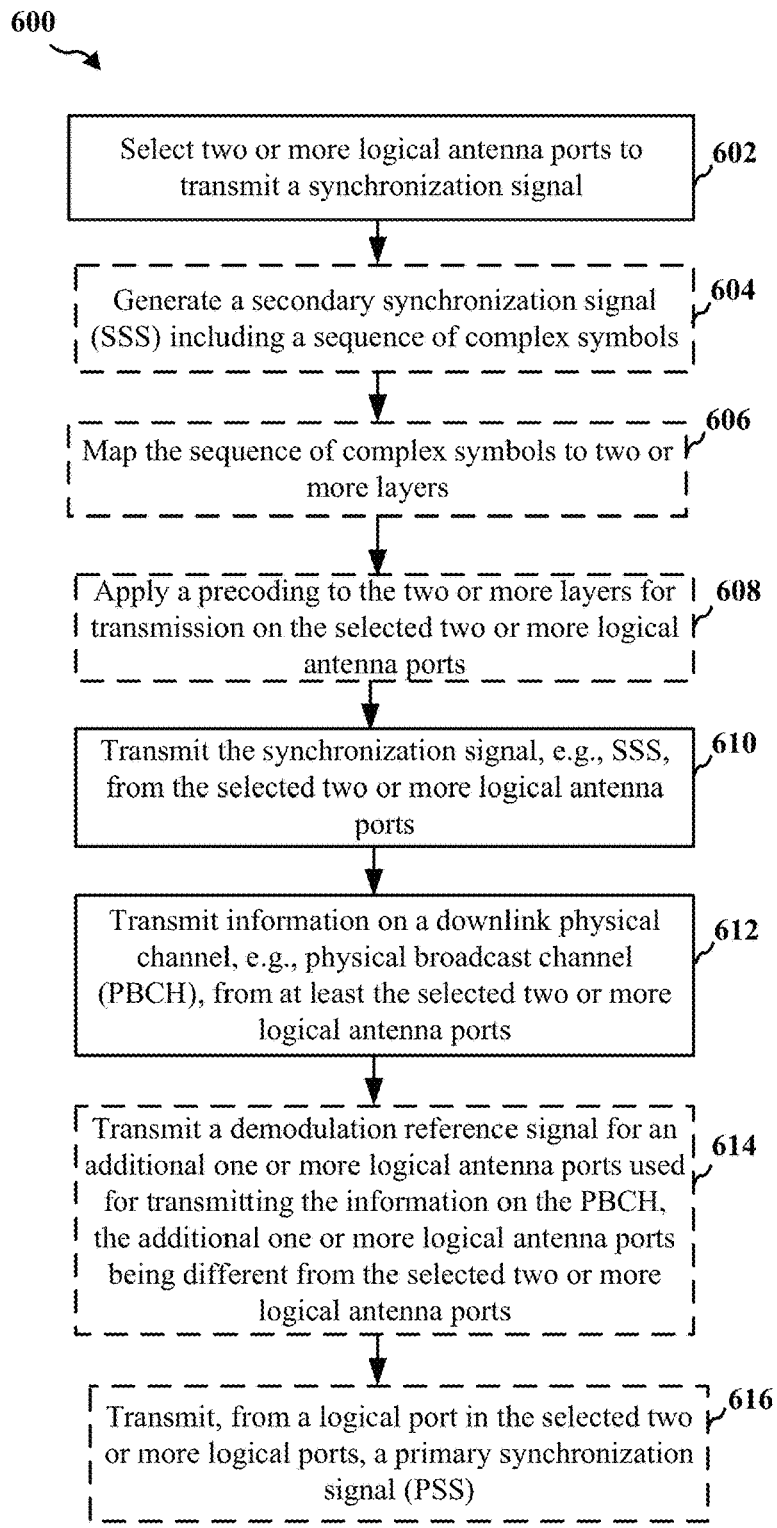
FIG. 6 is a flowchart of a method of wireless communication of a base station.

FIG. 6 is a flowchart 600 of a method of wireless communication. The method may be performed by an apparatus (e.g., the base station 402, the apparatus 802/802'). Some of the operations may be optional as represented by dashed boxes. At 602, the apparatus may select two or more logical antenna ports to transmit a synchronization signal. For example referring to FIG. 4, base station 402 may select a plurality of logical antenna ports to transmit the synchronization signal 412, e.g., to the UE 404. In some configurations, the transmitted synchronization signal 412 may be a SSS. In some embodiments, the synchronization signal 412 may be a PSS. For the purposes of discussion of the flowchart, consider that the synchronization signal 412 being transmitted by the base station is the SSS. In some embodiments the SSS may include a sequence of complex symbols. At 604, the apparatus (e.g., base station 402) may generate the SSS including a sequence of complex symbols by modulating a bit sequence, e.g., the bit sequence of the SSS. However, the sequence of complex symbols of the SSS may be generated in a variety of ways and/or based on a variety of sequences. For example in some configurations, the SSS to begin with may be a sequence of complex numbers, e.g., $S_0, S_1, S_2, \ldots, S_{N-1}$, and there may be no bit sequence that is modulated to obtain the sequence of complex symbols. In some configurations, the sequence of complex symbols of the SSS is based on a Zadoff-chu (ZC) sequence. In some such configurations, a root index of the ZC sequence is a function of at least one of: i) a primary synchronization signal ZC root index, ii) Cell ID or virtual Cell ID, or iii) periodicity of transmission of signals from the base station. The periodicity of transmission of signals may include periodicity of a beam sweep of the transmission of synchronization signals including the SSS and a PSS, or periodicity of a beam sweep of the transmission of information on the PBCH. In some configurations, the sequence of complex symbols of the SSS is a Zadoff-chu sequence cyclic shifted by a value. In some such configurations, the selected cyclic shift is a function of at least one of: i) a PSS ZC root index, ii) Cell ID or virtual Cell ID, iii) periodicity of transmission of signals, or iv) time of transmission of signals. The time of transmission of signals may be based on an OFDM symbol index, a slot number or a subframe number.

In accordance with an aspect, at 606 the apparatus (e.g., base station 402) may map the sequence of complex symbols of the SSS to two or more layers. The sequence to layer mapping may be done as discussed in detail with regard to FIG. 5 above and therefore the discussion will not be repeated. Briefly, the base station 402 may map the complex symbols of the SSS sequence to two or more layers in some embodiments. As discussed with respect to FIG. 5 (where the sequence is mapped to two layers) the base station 402 may map the complex symbols to two layers, e.g., by assigning the complex symbols in the sequence to two layers. Thus in such configurations, the base station 402 may use a layer mapping matrix such as the layer matrix 530. In some, but not necessarily all embodiments, there may be up to as many layers as there are logical antenna ports. At 608 the apparatus may apply precoding to the two or more layers (e.g., apply precoding factors to the modulation symbols in each layer) for transmission on the selected two or more logical antenna ports. Again referring to FIG. 5, the base station 402 may use the precoding matrix 535 for precoding the two layers onto which the complex symbols of the sequence are mapped. The precoding of the two layers produces two precoded streams of complex symbols. Each precoded stream may be then assigned to a respective one of two selected logical antenna ports. Again, as precoding has been discussed in more detail above with regard to FIG. 5, the discussion will not be repeated. Performing the layer mapping and precoding on the SSS may allow the apparatus (e.g., base station 402) to transmit the SSS from a plurality of logical antenna ports.

At 610 the apparatus may transmit the synchronization signal from the selected two or more logical antenna ports. Thus in the configuration where the synchronization signal is the SSS, the transmitting of the synchronization signal at 610 includes transmitting the precoded symbol streams of the SSS from the selected two or more logical antenna ports.

At 612 the apparatus may transmit information on a downlink physical channel from at least the selected two or more logical antenna ports. In some embodiments the downlink physical channel on which the information is transmitted is the PBCH and the information includes one or more parameters for use by system devices, e.g., UEs, for initial access of a cell such as, e.g., downlink system bandwidth, the Physical Hybrid ARQ Indicator Channel structure, and bits of the System Frame Number. For example, referring to FIG. 4, the base station 402 may transmit the information 414 on the PBCH using at least the same selected two or more logical antenna ports from which the SSS is transmitted. In some configurations, the information 414 on the PBCH may also be transmitted from additional logical antenna ports in addition to the two or more logical antenna ports. In accordance with one aspect, the SSS which is transmitted from the same two or more logical antenna ports as the PBCH information, may be used by a receiving device, e.g., UE 404, as a reference signal for demodulating the PBCH information. Since the SSS and the PBCH information are transmitted from the same logical antenna ports, at the receiver (e.g., UE) the SSS may be used for channel estimation for the two or more logical antenna ports and thus for demodulating the PBCH information. In some configurations, information on the PBCH may be transmitted using a 2-port Space Frequency Block Code (SFBC) transmission scheme. For example, the PBCH information may be transmitted from each of the 2 antenna ports using different coding and/or different frequency resources. In some other configurations, information on the PBCH may be transmitted using a 4-port SFBC transmission scheme. In some such configurations, where a 4-port SFBC is employed, the base station 402 may use a first logical antenna port and a third logical antenna port to transmit the information on the PBCH, where the first logical antenna port and the third logical antenna port are the selected two or more logical antenna ports used to transmit the synchronization signal. In another configuration, where a 4-port SFBC is employed, the base station 402 may use a second logical antenna port and a fourth logical antenna port to transmit the information on the PBCH, where the second logical antenna port and a fourth logical antenna port are the selected two or more logical antenna ports used to transmit the synchronization signal 412, e.g., SSS.

The SSS may serve as a reference signal for demodulating PBCH information transmitted from the same logical antennas ports as used to transmit the SSS. However if PBCH information is transmitted from additional antenna ports different from the selected two or more antenna ports then the base station may provide a separate reference signal for demodulation of the PBCH information transmitted from the different logical antenna ports. In some such configurations, at 614, the apparatus may transmit a demodulation reference signal for an additional one or more logical antenna ports used for transmitting the information on the PBCH, where the additional one or more logical antenna ports are different from the selected two or more logical antenna ports. For example, with reference to FIG. 4, the base station 402 may transmit a reference signal 416 for additional logical antenna port(s) which may be used for transmitting the information on the PBCH, e.g., if the additional logical antenna port(s) are different from the selected two or more logical antenna ports. In some configurations, the additional reference signals may be, e.g., a CRS or another DL reference (pilot) signal.

In some configurations, at 616, the apparatus may further transmit, from a logical port of the selected two or more logical ports, a PSS. Thus while an SSS transmitted from the same logical antenna ports as the PBCH information may allow demodulation of the PBCH information by a UE, in some embodiments the base station 402 may further transmit a PSS from at least one of the same logical antenna ports from which the SSS is transmitted. Transmitting the PSS from at least one of the same logical antenna ports from which the SSS is transmitted may allow the receiving UE to demodulate the PBCH information based on the PSS in addition to the received SSS. By using both the PSS and SSS for demodulation of PBCH, the receiving UE may be able to perform better channel estimation and the probability of successful decoding may also increase.

In one configuration, a base station may have a single logical antenna port (which may correspond to one or more physical antenna ports/elements). In such a case, in accordance with an aspect the base station may just transmit the signals corresponding to the one port. Conceptually, transmitting just the signals corresponding to one of the ports may be similar to the case where the base station transmits on more than one logical antenna port but the transmissions on the other ports do not reach the UE, e.g., due to adverse channel conditions. Since in the exemplary layer mapping and precoding scheme discussed above the resource element mapping is not dependent on the number of actual antenna ports, blind decoding by the UE, corresponding to multiple hypothesis on the number of logical antenna ports at the base station, may not be required.

While various aspects of an exemplary method are discussed with regard to flowchart 600, other variations are possible. Additionally, some of the features discussed above may be desirable in some configurations but may not necessarily be needed.

Figure 7:
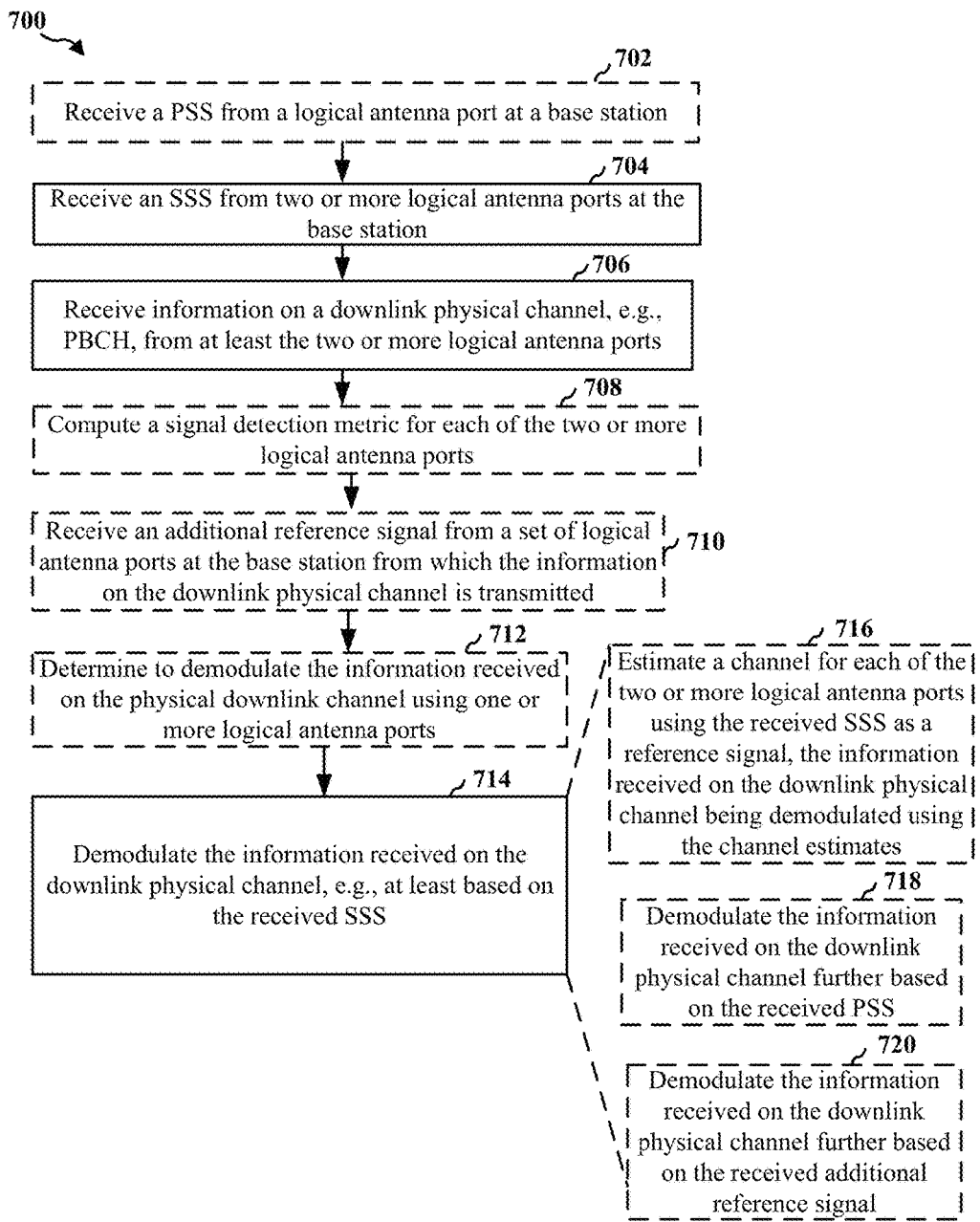
FIG. 7 is a flowchart of a method of wireless communication of a UE.

FIG. 7 is a flowchart 700 of a method of wireless communication. The method may be performed by an apparatus (e.g., the UE 404, the apparatus 1002/1002'). Blocks shown as dashed boxes are optional (correspond to optional operations) and may or may not be performed in certain embodiments. Reference to FIG. 4 will be made to facilitate the discussion of flowchart 700. At 702, the apparatus (e.g., UE 404) may receive a PSS from a logical antenna port at a base station, e.g., base station 402. At 704, the apparatus may receive a synchronization signal from two or more logical antenna ports at the base station. For example, referring to FIG. 4, the received signal may be the synchronization signal 412, e.g., an SSS, transmitted from two or more logical antenna ports at the base station 402. For discussion purposes, consider that the received signal is an SSS. At 706 the apparatus may receive information on a downlink physical channel, e.g., on PBCH, from at least the two or more logical antenna ports at the base station 402. For example, with reference to FIG. 4, the UE 404 may receive the information 414 on the PBCH that is transmitted by the base station 402 on at least the two or more logical antenna ports (from which the base station transmitted the SSS 412).

The apparatus being aware (e.g., due to preconfigured information) that the base station transmits synchronization signal (e.g., SSS) from the same two or more logical antenna ports that the base station uses to transmit the information on the PBCH, may perform further processing to use the received SSS as a reference signal for demodulating and decoding the information on the PBCH. At 708, the apparatus may compute a signal detection metric, e.g., an SSS detection metric, for each of the two or more logical antenna ports (from which the signal is transmitted). In some embodiments, the detection metric is based at least in part on the received signal (from block 704). For example, as discussed earlier with respect to FIGS. 4 and 5, in some configurations, the complex symbol sequence of the SSS is mapped to two layers and precoded prior to being transmitted from the two logical antenna ports. In the particular example of FIG. 5, the precoded symbol sequences (corresponding to the SSS) transmitted from the two logical antenna ports are orthogonal to each other (e.g., due to precoding) and the UE 404 may easily identify that the received SSS (e.g., signal 412) includes a complex number sequence transmitted from two logical antenna ports at the base station 402. Since in this case the SSS received by the UE at 704 was transmitted from two logical antenna ports, there exist a channel between each of the logical antenna ports (from which the SSS is transmitted) of the base station 402 and the UE. In order to determine channel estimates of each of these channels (corresponding to each of the two logical antenna ports), the UE 404 may generate a signal detection metric for each of the logical antenna ports based on the orthogonal complex symbol sequences of the received SSS. Each computed signal detection metric may indicate the probability of detecting the SSS from a logical antenna port for which the detection metric is computed, e.g., based on a comparison (e.g., correlation) of a known SSS sequence of the logical antenna port with the received SSS signal. Thus the apparatus generates a signal detection metric for each logical antenna port of the two or more logical antenna ports. In some configurations, however, instead of explicitly computing a signal detection metric for each of the two or more logical antenna ports at 708, the apparatus may compute a signal detection metric for one or more linearly independent combinations of the two or more logical antenna ports. For example, in case of two logical antenna ports, the apparatus may compute a signal detection metric for the sum of the two logical antenna ports and a signal detection metric for the difference of the two logical antenna ports. This may be considered as implicitly computing a signal detection metric for each of the two logical antenna ports. The generated signal detections metrics may then be used in demodulation of PBCH information transmitted from the same logical antenna ports by the base station.

In some configurations, if an individual signal detection metric corresponding to a logical (transmission) antenna port indicates a lower than desired probability of SSS detection, the apparatus may consider that the SSS is not detected from the logical antenna port due to a lower than desired probability of detection. In some such configurations, the apparatus may decide to not consider such logical antenna ports relevant (e.g., for channel estimation purposes) at the time of demodulation/decoding of the PBCH information as will be discussed further below.

At 710, the apparatus may receive an additional reference signal from a set of logical antenna ports at the base station from which the information on the PBCH is transmitted. In some configurations, the set of logical antenna ports may be different from the two or more logical antenna ports used for SSS transmission. For example, as discussed with regard to FIG. 4, the base station 402 may transmit the PBCH information from an additional logical antenna port(s) and may therefore transmit an additional reference signal 416 from such additional logical antenna port(s) to allow the UE 404 to perform channel estimation for demodulating the PBCH information. In some configurations, the apparatus may determine signal detection metric(s) for the additional logical antenna port(s) (e.g., indicating a probability of detection of a meaningful signal from the additional logical antenna port) to decide whether the additional logical antenna port(s) (e.g., channel(s) between the receiving apparatus and the additional logical antenna port(s) of the base station) should be considered in demodulation of the received PBCH information. The additional reference signal may be a pilot signal transmitted at a known signal strength. In such a case the signal detection metric may be calculated based on a comparison of received signal strength with known transmission power of the additional reference signal. In some configurations, the signal detection metric corresponding to the additional reference signal may be used for estimating the channel, e.g., the channel between the additional logical antenna port(s) from which the additional reference signal is transmitted and the apparatus.

At 712, the apparatus may determine to demodulate the information received on the downlink physical channel (e.g., PBCH) using one or multiple logical antenna ports, e.g., based on the individual signal detection metrics corresponding to the one or more logical antenna ports. That is, based on the generated individual signal detection metrics corresponding to the individual antenna ports, the apparatus may determine whether to decode the PBCH information as a single antenna port transmission or as a multiple antenna port transmission. For example, if the signal detection metrics corresponding to a received signal (e.g., SSS, PSS, or the additional reference signal) is lower than a threshold then a logical antenna port from which the signal was transmitted may be ignored from consideration for use in channel estimation. In some configurations, the apparatus may decide to ignore or drop a logical antenna port (e.g., for channel estimation purposes) from consideration for the purposes of demodulation of PBCH information if the apparatus determines that a very low signal level and/or just noise is detected from such antenna port. Thus, while the information on the PBCH (e.g., 414) may be transmitted by the base station 402 on two or more ports, from the perspective of the apparatus (e.g., UE 404), the apparatus may not consider all of the two or more logical antenna ports for use in demodulation of the PBCH information if the detection metric of the received signal (SSS and/or PSS and/or additional reference) used as a demodulation reference indicates that no meaningful signal is detected/received from some of the logical antenna ports.

While not necessary in all configurations, for discussion purposes however we may consider that the apparatus may determine to demodulate the information received on the downlink physical channel (e.g., PBCH) using at least the two logical antenna ports from which SSS was transmitted, and may also determine to use one or more additional logical antenna ports, e.g., corresponding to PSS and/or additional reference signal transmissions assuming the signal detection metrics for the logical antenna ports from which these signals are transmitted are above a threshold level. At 714, the apparatus may demodulate the information received on the downlink physical channel, e.g., at least based on the received SSS. While the apparatus may be configured to demodulate the PBCH based at least on the received SSS, as discussed above in some embodiments, the additional reference signal and/or PSS may be used in demodulating the PBCH information in addition to the SSS depending on the given configuration and how (e.g., using which logical antenna ports) the PBCH information is transmitted from the base station. Accordingly, in some configurations, the apparatus may be further configured to operate as discussed with regard one or more of 716, 718 and 720, as part of demodulating the information received on the PBCH at 714. Thus, in some configurations, the operation at 714 may include performing one or more of the operations discussed with regard to 716, 718 and 720.

At 716, the apparatus may estimate a channel corresponding to each logical antenna port of the two or more logical antenna ports using the received SSS as a reference signal. As discussed with respect to FIG. 4, since the base station 402 may use at least the same logical antenna ports for transmission of information 414 on the downlink channel (e.g., PBCH) that are used to transmit the SSS 412, the receiving UE 404 (e.g., the apparatus in this example) may use the SSS 412 for channel estimation and demodulation of the PBCH information. Thus, in some configurations, the information received on the downlink physical channel is demodulated using the generated channel estimates for the two or more logical antenna ports used for SSS transmission by the base station. For example, referring to FIG. 4, the UE 404 may use the received SSS 412 as a reference signal to generate channel estimates for each logical antenna port of the two more logical antenna ports at the base station 402 from which SSS 412 is transmitted. The channel estimates corresponding to each of the logical antenna ports may be determined based on the individual signal detection metrics corresponding to each of the logical antenna ports as discussed above, e.g., based on a comparison of a received signal with a known signal and determining the probability of detection. Subsequently the apparatus may demodulate the information on the PBCH using the generated channel estimates. Again the channel estimates for each logical antenna port of the two or more logical antenna ports are used for PBCH demodulation purposes provided that the apparatus has decided that the two or more logical antenna ports are to be considered for demodulation, e.g., based on the SSS detection metric and/or the channel estimates.

In some configurations, the apparatus may further consider the received PSS as a reference for demodulating the information received on the downlink physical channel. In such configurations, at 718, the apparatus may demodulate the information received on the downlink physical channel (e.g., PBCH information) further based on the received PSS. As discussed earlier, in some configurations the PSS may be received from one of the logical antenna ports of the two or more logical antenna ports of the base station used for transmitting the SSS and may be used for demodulation of the PBCH information in some embodiments. In some configurations, as part of the operation at 718 the apparatus may generate a channel estimate for the logical antenna port used for PSS transmission (i.e., estimate for the channel between the logical antenna port at the base station used for PSS transmission and the apparatus, e.g., the receiving UE)

based on the received PSS and demodulate the received PBCH further based on the generated channel estimate.

In some configurations, the apparatus may further consider the received additional reference signal for demodulating the information received on the downlink physical channel. Thus in such configurations, at 720, the apparatus may demodulate the information received on the downlink physical channel (e.g., PBCH information) further based on the received additional reference signal. Accordingly, in some configurations where the base station may transmit PBCH information from additional logical antenna ports in addition to the two or more logical antenna ports used for SSS transmission, the base station may further provide the additional reference signal to allow the apparatus (e.g., the receiving UE) to estimate the channel(s) corresponding to the additional antenna ports and apply channel estimate(s) while demodulating the PBCH information. While not illustrated separately in FIG. 7 flowchart with regard to a received PSS and/or additional reference signals, it should be understood that one or more operations performed by the apparatus with regard to an SSS may also be performed for a received PSS and/or additional reference signals. For example, as discussed above with respect to blocks 718 and 720, the apparatus may compute signal detection metrics for detection of a PSS and detection of an additional reference signal and may take such detection metrics under consideration to decide whether to demodulate PBCH based on the received PSS and/or additional reference signal. Similarly, the apparatus may also generate channel estimates for the logical antenna ports from which PSS and/or the additional reference signal was transmitted in a similar manner as discussed with regard to SSS. As discussed above, in some configurations where the apparatus may decide to demodulate the PBCH information further based on the PSS and/or additional reference signal, the apparatus may use the generated channel estimates for the logical antenna ports from which PSS and/or the additional reference signal was transmitted to demodulate the PBCH information.

Figure 8:
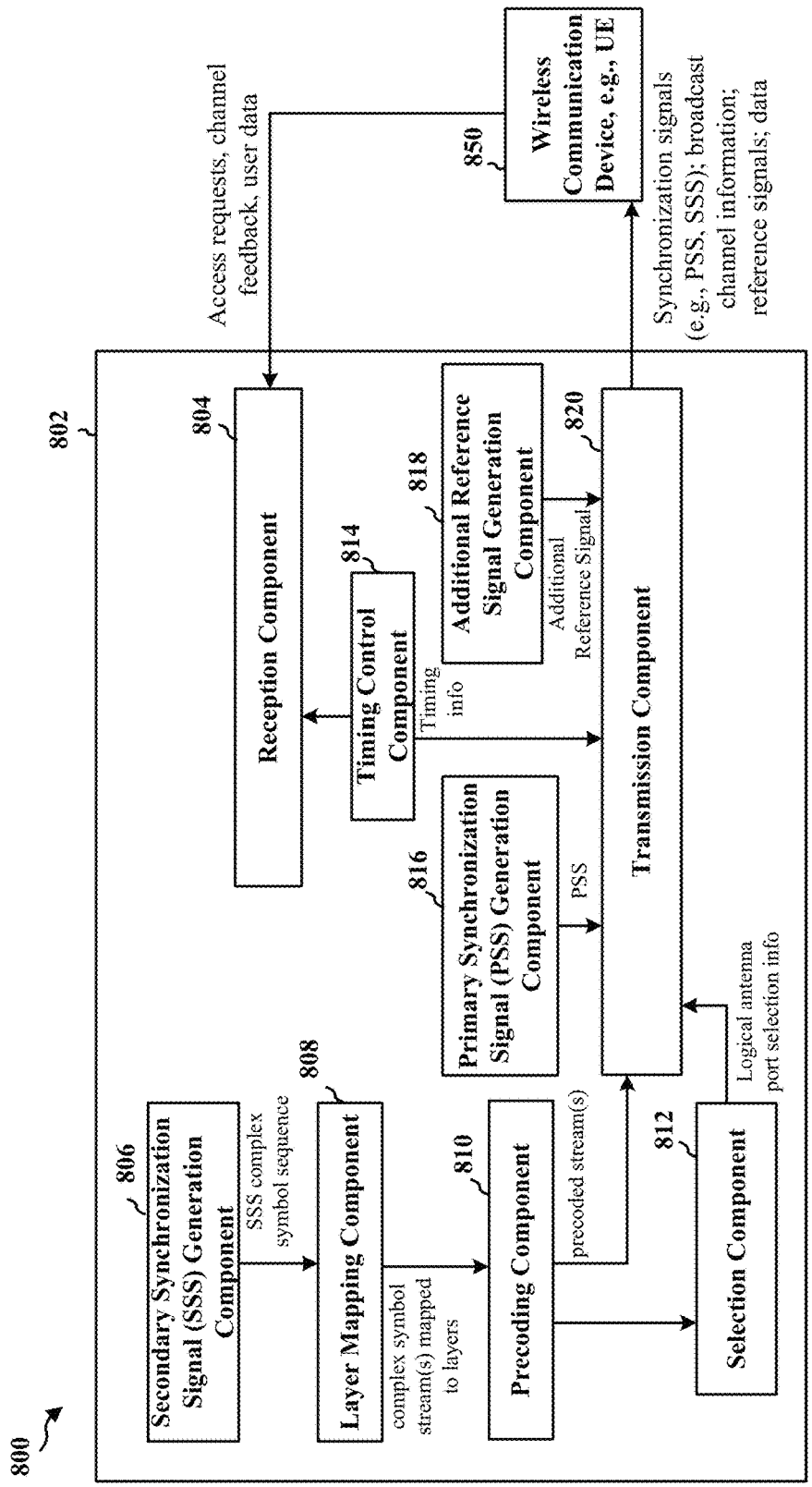
FIG. 8 is a conceptual data flow diagram illustrating the data flow between different means/components in an exemplary apparatus.

FIG. 8 is a conceptual data flow diagram 800 illustrating the data flow between different means/components in an exemplary apparatus 802. The apparatus may be a base station, e.g., an eNB, such as the base station 402. The apparatus may include a reception component 804, a SSS generation component 806, a layer mapping component 808, a precoding component 810, a selection component 812, a timing control component 814, a PSS generation component 816, an additional reference signal generation component 818 and a transmission component 820.

The reception component 804 may be configured to receive and process signals and/or information from other devices. For example, the received signals and/or information may include access requests, scheduling requests, channel feedback (e.g., channel quality indicators), user data etc., from one or more UEs. The SSS generation component 806 may be configured to generate an SSS signal for transmission The SSS signal includes a sequence of complex symbols. Thus the SSS generation component 806 may be configured to generate the sequence of complex symbols as part of being configured to generate the SSS. In some configurations, the SSS generation component 806 may be configured to generate the sequence of complex symbols by modulating an SSS bit sequence. In some configurations, the SSS generation component 806 may be configured to generate the sequence of complex symbols of the SSS based on a Zadoff-chu (ZC) sequence. In some such configurations, the root index of the ZC sequence is a function of at least one of: i) a primary synchronization signal ZC root index, ii) Cell ID or virtual Cell ID, or iii) periodicity of transmission of signals from the base station. In some other configurations, the SSS generation component 806 may be configured to generate the sequence of complex symbols based on a Zadoff-chu (ZC) sequence cyclic shifted by a value. In some such configurations, the SSS generation component 806 and/or other component selects the cyclic shift as a function of at least one of: i) a primary synchronization signal ZC root index, ii) Cell ID or virtual Cell ID, iii) periodicity of transmission of signals, or iv) time of transmission of signals. For example, the SSS generation may generate the SSS sequence such as the one shown in equation (1) and discussed above. Referring to FIG. 4, the generated SSS signal for transmission may be the signal 412.

The layer mapping component 808 may be configured to map the sequence of complex symbols to two or more layers. For example, referring to FIG. 5 example the layer mapping may be performed in accordance with the layer mapping matrix 530. The result of the layer mapping, e.g., the complex symbols mapped to the layers are provided to the precoding component 810. The precoding component 810 may be configured to apply a precoding to the two or more layers for transmission on a selected plurality of logical antenna ports. For example, as discussed with respect to FIG. 5, the base station 402 may use the precoding matrix 535 for precoding the two layers onto which the complex symbols of the sequence are mapped, e.g., precoding factors may be applied to the complex modulation symbols in each layer. The precoding of the two layers produces two precoded streams of complex symbols.

The selection component 812 may be configured to select two or more logical antenna ports for transmission of a synchronization signal, e.g., SSS signal, and provide the selection information to the transmission component 820. The selection component 812 may be further configured to select logical antenna port(s) to transmit PSS and/or additional reference signal in some configurations. In some configurations, where a 4-port SFBC transmission scheme is used for transmission of information on the downlink broadcast channel (e.g., PBCH), the selection component 812 may be further configured to select which logical antenna ports out of the 4 to use for transmitting the PBCH information and for SSS transmission as discussed earlier with respect to FIGS. 4 and 6. The timing control component 814 may be configured to provide transmission/reception timing information to the transmission and reception components 820 and 804, respectively, to control transmission and reception of signals and/or other information. The PSS generation component 816 may be configured to generate a PSS for transmission. The additional reference signal generation component 818 may be configured to generate an additional reference signal, e.g., reference signal 416 of FIG. 4, for transmission. The additional reference signal may be transmitted in some configurations where the information on the PBCH is transmitted from an additional logical antenna port (in addition to being transmitted from the selected two or more logical antenna ports).

The transmission component 820 may be configured to transmit a synchronization signal, e.g., generated SSS, from selected two or more logical antenna ports, where the selection may be based on the information provided by the selection component 812. The transmission component 820 may be further configured to transmit information on a downlink physical channel (e.g., PBCH) from at least the selected two or more logical antenna ports. In some configurations, the transmission component 820 may be further configured to transmit information on the PBCH from one or more additional logical antenna ports. The transmission component may be configured to map the selected logical antenna ports to actual physical antennas of the apparatus 802. In some configurations, the transmission component 820 may be further configured to transmit the information on the PBCH using 2-port SFBC transmission scheme. In some other configurations, the transmission component 820 may be configured to transmit the information on the PBCH using 4-port SFBC transmission scheme. In some such configurations, the transmission component 820 may be further configured to use a first and a third logical antenna ports to transmit the information on the PBCH, the first and the third logical antenna ports being the selected two or more logical antenna ports used to transmit the synchronization signal. In some configurations, the transmission component 820 may be further configured to use a second and a fourth logical antenna ports to transmit said information on the PBCH, the second and a fourth logical antenna ports being the selected two or more logical antenna ports used to transmit the synchronization.

In some configurations, the transmission component 820 may be further configured to transmit an additional reference signal, e.g., demodulation reference signal, for an additional one or more logical antenna ports used for transmitting the information on the PBCH, where the additional one or more logical antenna ports are different from the selected two or more logical antenna ports. In some configurations, the transmission component 820 may be further configured to transmit, from a logical antenna port in the selected two or more logical antenna ports, the PSS. The transmission component 820 may perform directional transmissions, e.g., by beamforming, as may be desirable in some configurations.

The apparatus may include additional components that perform each of the blocks of the algorithm in the aforementioned flowcharts of FIG. 6. As such, each block in the aforementioned flowcharts of FIG. 6 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 9:
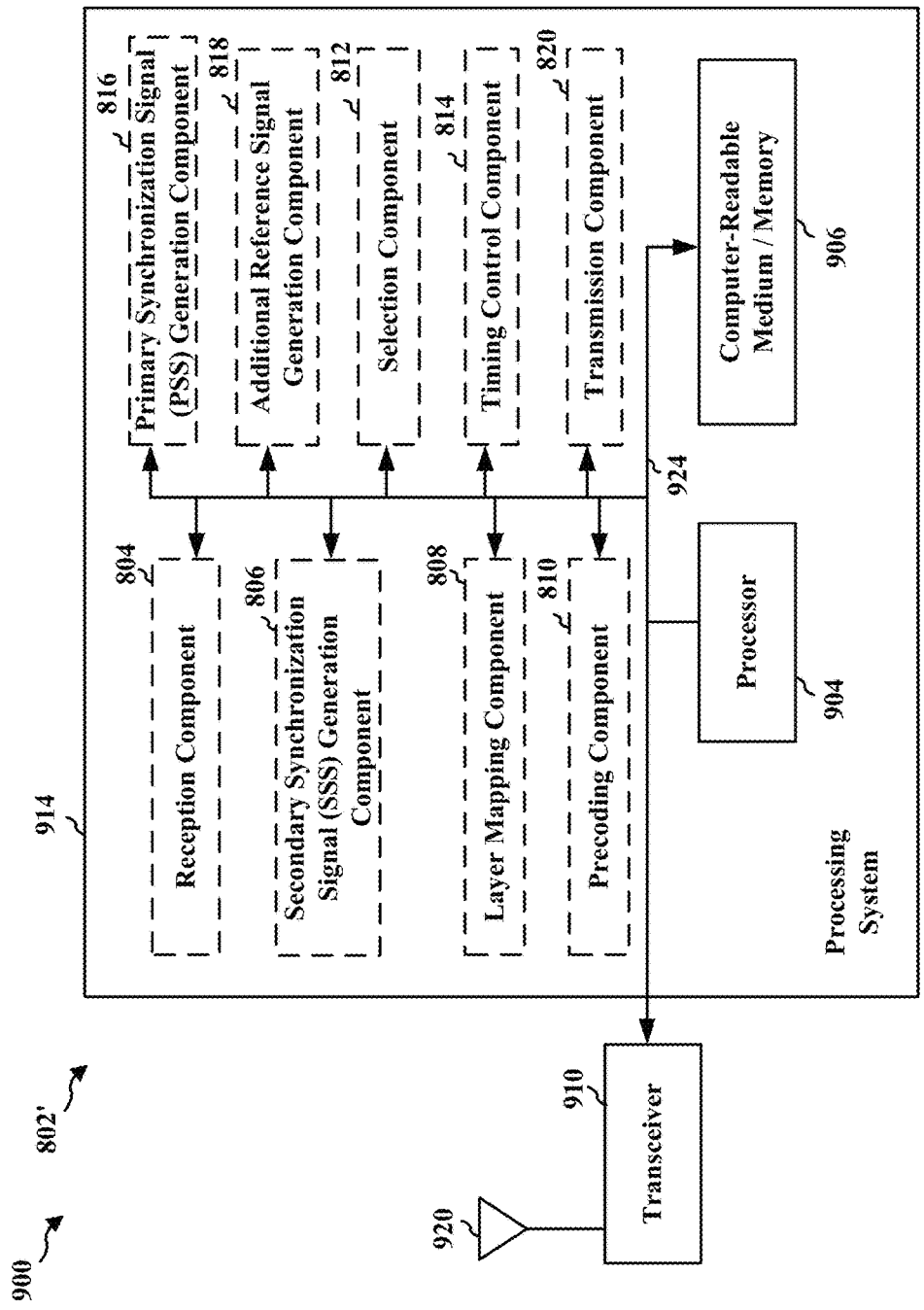
FIG. 9 is a diagram illustrating an example of a hardware implementation for an apparatus employing a processing system.

FIG. 9 is a diagram 900 illustrating an example of a hardware implementation for an apparatus 802' employing a processing system 914. The processing system 914 may be implemented with a bus architecture, represented generally by the bus 924. The bus 924 may include any number of interconnecting buses and bridges depending on the specific application of the processing system 914 and the overall design constraints. The bus 924 links together various circuits including one or more processors and/or hardware components, represented by the processor 904, the components 804, 806, 808, 810, 812, 814, 816, 818, 820 and the computer-readable medium/memory 906. The bus 924 may also link various other circuits such as timing sources, peripherals, voltage regulators, and power management circuits, which are well known in the art, and therefore, will not be described any further.

The processing system 914 may be coupled to a transceiver 910. The transceiver 910 is coupled to one or more antennas 920. The transceiver 910 provides a means for communicating with various other apparatus over a transmission medium. The transceiver 910 receives a signal from the one or more antennas 920, extracts information from the received signal, and provides the extracted information to the processing system 914, specifically the reception component 804. In addition, the transceiver 910 receives information from the processing system 914, specifically the transmission component 820, and based on the received information, generates a signal to be applied to the one or more antennas 920. The processing system 914 includes a processor 904 coupled to a computer-readable medium/memory 906. The processor 904 is responsible for general processing, including the execution of software stored on the computer-readable medium/memory 906. The software, when executed by the processor 904, causes the processing system 914 to perform the various functions described supra for any particular apparatus. The computer-readable medium/memory 906 may also be used for storing data that is manipulated by the processor 904 when executing software. The processing system 914 further includes at least one of the components 804, 806, 808, 810, 812, 814, 816, 818, 820. The components may be software components running in the processor 904, resident/stored in the computer readable medium/memory 906, one or more hardware components coupled to the processor 904, or some combination thereof. The processing system 914 may be a component of the base station 310 and may include the memory 376 and/or at least one of the TX processor 316, the RX processor 370, and the controller/processor 375.

In one configuration, the apparatus 802/802' for wireless communication includes means for selecting two or more logical antenna ports to transmit a synchronization signal, means for transmitting the synchronization signal from the selected two or more logical antenna ports, and means for transmitting information on a downlink physical channel from at least the selected two or more logical antenna ports. In some configurations, the apparatus 802/802' further includes means for generating a SSS by generating a sequence of complex symbols, means for mapping the sequence of complex symbols to two or more layers, means for applying a precoding to the two or more layers for transmission on the selected two or more logical antenna ports, means for transmitting a demodulation reference signal for an additional one or more logical antenna ports used for transmitting the information on the PBCH, the additional one or more logical antenna ports being different from the selected two or more logical antenna ports, and means for transmitting a PSS from a logical antenna port in the selected two or more logical antenna ports. The aforementioned means may be one or more of the aforementioned components of the apparatus 802 and/or the processing system 914 of the apparatus 802' configured to perform the functions recited by the aforementioned means. As described supra, the processing system 914 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

In one configuration, an exemplary apparatus, e.g., apparatus 802/802', comprises: a memory (e.g., memory 906) and at least one processor (e.g., processor 904) coupled to the memory. The at least one processor may be configured to: select two or more logical antenna ports to transmit a synchronization signal (e.g., SSS), transmit the synchronization signal from the selected two or more logical antenna ports, and transmit information on a downlink physical channel (e.g., PBCH) from at least the selected two or more logical antenna ports.

Figure 10:
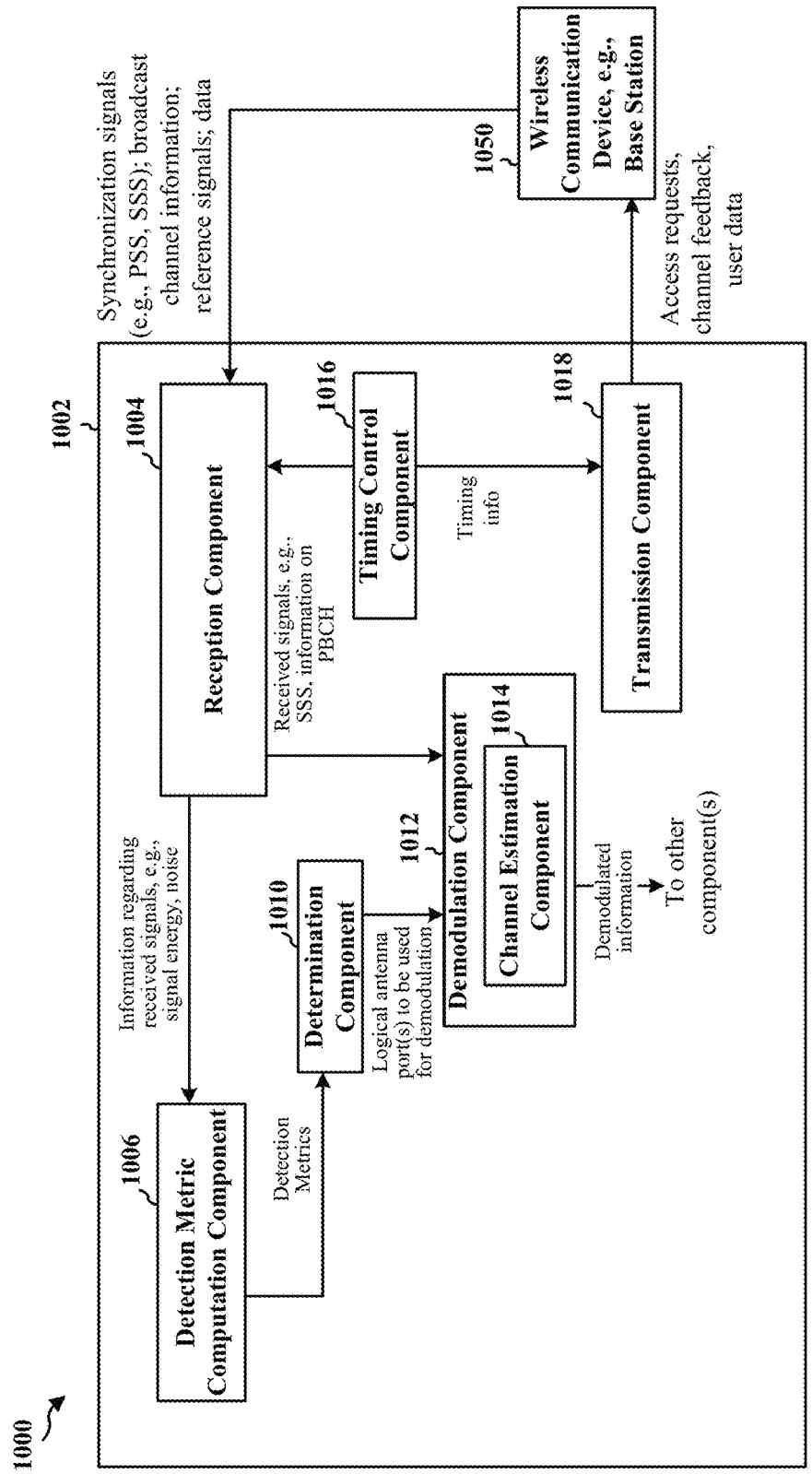
FIG. 10 is a conceptual data flow diagram illustrating the data flow between different means/components in another exemplary apparatus.

FIG. 10 is a conceptual data flow diagram 1000 illustrating the data flow between different means/components in an exemplary apparatus 1002. The apparatus may be a user equipment (UE), e.g., such as the UE 404. The apparatus may include a reception component 1004, a signal detection metric computation component 1006, a determination component 1010, a demodulation component 1012, a channel estimation component 1014, a timing control component 1016, and a transmission component 1018.

The reception component 1004 may be configured to receive and process signals and/or information from other devices. For example, the reception component 1004 may be configured to receive a synchronization signal (e.g., SSS) from two or more logical antenna ports at a base station. The reception component 1004 may be further configured to receive information on a downlink physical channel (e.g., PBCH) from at least the two or more logical antenna ports. For example, referring to FIG. 4, the apparatus 1002 may be the UE 404 and may receive, via the reception component 1004, the SSS 412 from two or more logical antenna ports at a base station 402, and receive information 414 on the PBCH from at least the same two or more logical antenna ports. In some configurations, the reception component 1004 may be further configured to receive an additional reference signal from a set of logical antenna ports at the base station from which the information on the downlink physical channel is transmitted. For example, again referring to FIG. 4, the UE 404 may receive, via the reception component 1004, the reference signal 416 from one or more logical antenna port(s) at the base station 402 which may be different from the two or more logical antenna ports used for SSS transmission. In some configurations, the reception component 1004 may be further configured to receive a PSS from a logical antenna port at the base station. The received signals and/or information may be provided to one or more other components of the apparatus 1002 for further processing and/or use.

The signal detection metric computation component 1006 may be configured to compute a detection metric for each of the two or more logical antenna ports from which the SSS is transmitted. The detection metric may be computed by component 1006 based at least in part on the received SSS signal as discussed in more detail with respect to the flowchart 700. In some configurations, signal detection metric computation component 1006 may be further configured to determine a signal detection metric for a logical antenna port from which the PSS is transmitted. The determination component 1010 may receive input from the signal detection metric computation component 1006, e.g., indicating one or more computed signal detection metrics in some configurations. The determination component 1010 may be further configured to determine, based on the computed detection metric for each of the logical antenna ports, which one or more logical antenna ports to use to demodulate the information received on the PBCH. For example, the determination component 1010 may be configured to determine, based on the individual signal detection metrics corresponding to the individual logical antenna ports, whether to decode the PBCH information as a single antenna port transmission or as a multiple antenna port transmission.

The demodulation component 1012 may be configured to demodulate the information received on the downlink physical channel (e.g., the information received on the PBCH) based at least on the received synchronization signal (e.g., SSS). The demodulation component 1012 may be further configured to estimate a channel for each of the two or more logical antenna ports using the received SSS as a reference signal and use the channel estimates to demodulate the information received on the downlink physical channel. The channel estimates may be generated by the channel estimation component 1014 which may be implemented as part of the demodulation component 1012 or as a standalone component in some other configurations.

In some configurations, the demodulation component 1012 may be further configured to demodulate the information received on the downlink physical channel further based on the additional reference signal received from a set of logical antenna ports of the base station. In some such configurations, the channel estimation component 1014 may be further configured to generate channel estimate(s) for the set of logical antenna ports at the base station from which the additional reference signal is transmitted. In some configurations, the demodulation component 1012 may be further configured to demodulate the information received on the downlink physical channel further based on the received PSS. In some such configurations, the demodulation component 1012 and/or the channel estimation component 1014 may be further configured to estimate a channel for a logical antenna port using the received PSS as a reference signal and use the channel estimate to demodulate the information received on the PBCH.

The timing control component 1016 may be configured to provide transmission/reception timing information to the transmission and reception components 1018 and 1004, respectively, to control transmission and reception of signals and/or other information. The transmission component 1018 may be configured to transmit a signals and/or information to external devices such as the wireless communication device 1050 which may be a base station. The transmitted signals and/or information may include access requests, channel feedback, user data etc.

The apparatus may include additional components that perform each of the blocks of the algorithm in the aforementioned flowcharts of FIG. 7. As such, each block in the aforementioned flowcharts of FIG. 7 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 11:
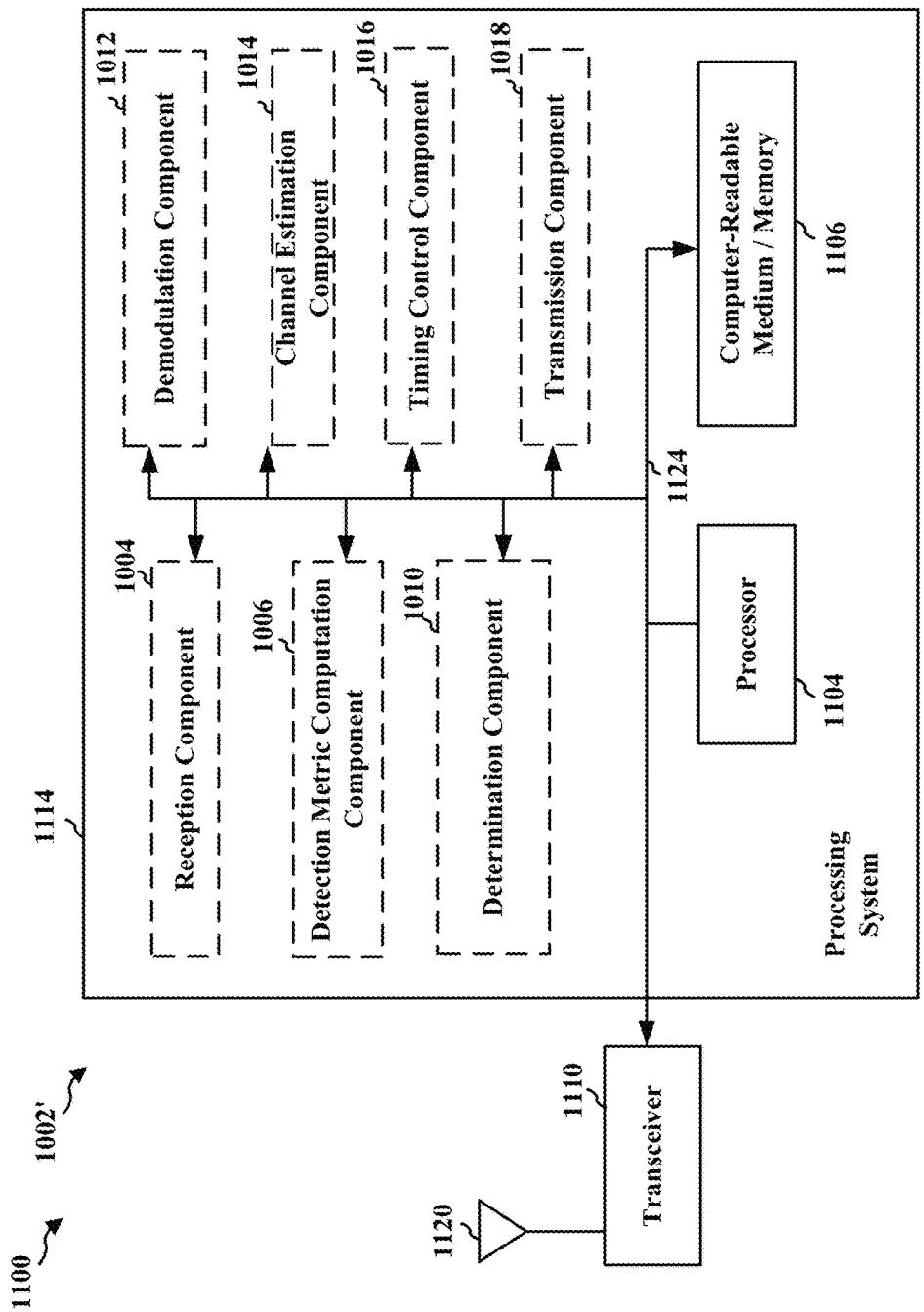
FIG. 11 is a diagram illustrating an example of a hardware implementation for an apparatus employing a processing system.

FIG. 11 is a diagram 1100 illustrating an example of a hardware implementation for an apparatus 1002' employing a processing system 1114. The processing system 1114 may be implemented with a bus architecture, represented generally by the bus 1124. The bus 1124 may include any number of interconnecting buses and bridges depending on the specific application of the processing system 1114 and the overall design constraints. The bus 1124 links together various circuits including one or more processors and/or hardware components, represented by the processor 1104, the components 1004, 1006, 1010, 1012, 1014, 1016, 1018 and the computer-readable medium/memory 1106. The bus 1124 may also link various other circuits such as timing sources, peripherals, voltage regulators, and power management circuits, which are well known in the art, and therefore, will not be described any further.

The processing system 1114 may be coupled to a transceiver 1110. The transceiver 1110 is coupled to one or more antennas 1120. The transceiver 1110 provides a means for communicating with various other apparatus over a transmission medium. The transceiver 1110 receives a signal from the one or more antennas 1120, extracts information from the received signal, and provides the extracted information to the processing system 1114, specifically the reception component 1004. In addition, the transceiver 1110 receives information from the processing system 1114, specifically the transmission component 1018, and based on the received information, generates a signal to be applied to the one or more antennas 1120. The processing system 1114 includes a processor 1104 coupled to a computer-readable medium/memory 1106. The processor 1104 is responsible for general processing, including the execution of software stored on the computer-readable medium/memory 1106. The software, when executed by the processor 1104, causes the processing system 1114 to perform the various functions described supra for any particular apparatus. The computer-readable medium/memory 1106 may also be used for storing data that is manipulated by the processor 1104 when executing software. The processing system 1114 further includes at least one of the components 1004, 1006, 1010, 1012, 1014, 1016, 1018. The components may be software components running in the processor 1104, resident/stored in the computer readable medium/memory 1106, one or more hardware components coupled to the processor 1104, or some combination thereof. The processing system 1114 may be a component of the UE 350 and may include the memory 360 and/or at least one of the TX processor 368, the RX processor 356, and the controller/processor 359.

In one configuration, the apparatus 1002/1002' for wireless communication includes means for receiving a synchronization signal from two or more logical antenna ports at a base station, and means for receiving information on a downlink physical channel from at least the two or more logical antenna ports. In some configurations, the apparatus 1002/1002' may further include means for demodulating the information received on the downlink physical channel based on the received synchronization signal. In some configurations, the means for demodulating the information received on the downlink physical channel is configured to estimate a channel for each of the two or more logical antenna ports using the received SSS as a reference signal and use the channel estimates to demodulate the information received on the downlink physical channel.

In some configurations, the apparatus 1002/1002' may further include means for receiving an additional reference signal from a set of logical antenna ports at the base station from which the information on the downlink physical channel is transmitted. In some such configurations, the means for demodulating is further configured to demodulate the information received on the downlink physical channel further based on the received additional reference signal. In some configurations, the apparatus 1002/1002' may further include means for computing a detection metric for each of the two or more logical antenna ports from which the SSS is transmitted, based at least in part on the received SSS signal. In some configurations, the apparatus 1002/1002' may further include means for determining a set of logical antenna ports to use to demodulate the information received on the downlink channel based on the computed detection metric. In some configurations, the apparatus 1002/1002' for wireless communication may further include means for receiving a PSS from a logical antenna port at the base station. In some such configurations, the means for demodulating is further configured to demodulate the information received on the downlink physical channel further based on the received PSS. The aforementioned means may be one or more of the aforementioned components of the apparatus 1002 and/or the processing system 1114 of the apparatus 1002' configured to perform the functions recited by the aforementioned means. As described supra, the processing system 1114 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

In one configuration, an exemplary apparatus, e.g., apparatus 1002/1002', comprises: a memory (e.g., memory 1106) and at least one processor (e.g., processor 1104) coupled to the memory. The at least one processor may be configured to: receive a synchronization signal from two or more logical antenna ports at a base station, receive information on a downlink physical channel from at least the two or more logical antenna ports, and demodulate the information received on the downlink physical channel based on the received synchronization signal.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of communication of a base station, comprising:

selecting two or more logical antenna ports to transmit a secondary synchronization signal (SSS);

transmitting the SSS from the selected two or more logical antenna ports; and
transmitting information on a physical broadcast channel (PBCH) from at least the selected two or more logical antenna ports, wherein the SSS includes a sequence of complex symbols, the method further comprising:
mapping the sequence of complex symbols to two or more layers; and
applying a precoding to the two or more layers for transmission on the selected two or more logical antenna ports.

2. The method of claim 1, further comprising:
generating the sequence of complex symbols by modulating an SSS bit sequence.

3. The method of claim 1, wherein the sequence of complex symbols of the SSS is based on a Zadoff-chu (ZC) sequence.

4. The method of claim 3, wherein a root index of the ZC sequence is a function of at least one of: i) a primary synchronization signal (PSS) ZC root index, ii) Cell identity (ID) or virtual Cell ID, or iii) periodicity of transmission of signals from the base station.

5. The method of claim 1, wherein the sequence of complex symbols of the SSS is a Zadoff-chu sequence cyclic shifted by a value.

6. The method of claim 5, wherein the value is a function of at least one of: i) a primary synchronization signal (PSS) ZC root index, ii) Cell identity (ID) or virtual Cell ID, iii) periodicity of transmission of signals, or iv) time of transmission of signals.

7. The method of claim 1, further comprising:
transmitting a demodulation reference signal for an additional one or more logical antenna ports used for transmitting the information on the PBCH, the additional one or more logical antenna ports being different from the selected two or more logical antenna ports.

8. The method of claim 1, further comprising:
transmitting, from a logical antenna port of the selected two or more logical antenna ports, a primary synchronization signal £PSS.

9. An apparatus for wireless communication, comprising:
a memory; and
at least one processor coupled to the memory and configured to:
select two or more logical antenna ports to transmit a secondary synchronization signal (SSS);
transmit the SSS from the selected two or more logical antenna ports; and
transmit information on a physical broadcast channel (PBCH) from at least the selected two or more logical antenna ports, wherein the SSS includes a sequence of complex symbols, and
wherein the at least one processor is further configured to:
map the sequence of complex symbols to two or more layers; and
applying a precoding to the two or more layers for transmission on the selected two or more logical antenna ports.

10. The apparatus of claim 9, wherein the at least one processor is further configured to:
transmit a demodulation reference signal for an additional one or more logical antenna ports used for transmitting the information on the PBCH, the additional one or more logical antenna ports being different from the selected two or more logical antenna ports.

11. The apparatus of claim 9, wherein the at least one processor is further configured to:
transmit, from a logical antenna port of the selected two or more logical antenna ports, a primary synchronization signal (PSS).

12. A method of communication of a user equipment (UE), comprising:
receiving a secondary synchronization signal (SSS) from two or more logical antenna ports at a base station, wherein the SSS includes a sequence of complex symbols mapped to two or more layers and having a precoding applied to the two or more layers for reception from the two or more antenna ports;
receiving information on a physical broadcast channel (PBCH) from at least the two or more logical antenna ports of the base station from which the SSS is transmitted; and
demodulating the information received on the PBCH based on the PSS or the SSS received from the at least the two or more logical antenna ports.

13. The method of claim 12, wherein demodulating the information received on the PBCH comprises:
determining a channel estimate for each of the two or more logical antenna ports using the received SSS as a reference signal, wherein the information received on the PBCH is demodulated using determined channel estimates.

14. The method of claim 12, further comprising:
computing a detection metric for each of the two or more logical antenna ports from which the SSS is transmitted.

15. The method of claim 14, wherein the detection metric for each of the two or more logical antenna ports is based at least in part on the received SSS.

16. The method of claim 14, further comprising:
determining to demodulate the information received on the PBCH using a set of antenna ports, wherein the set of antenna ports is based on the detection metric.

17. The method of claim 12, further comprising:
receiving a primary synchronization signal (PSS) from a logical antenna port of the two or more antenna ports at the base station; and
wherein the information received on the PBCH is demodulated further based on the received PSS.

18. The method of claim 12, further comprising:
receiving a demodulation reference signal for an additional one or more logical antenna ports used for transmitting the information on the PBCH, the additional one or more logical antenna ports being different from the two or more logical antenna ports.

19. An apparatus for wireless communication, comprising:
a memory; and
at least one processor coupled to the memory and configured to:
receive a secondary synchronization signal (SSS) from two or more logical antenna ports at a base station, wherein the SSS includes a sequence of complex symbols mapped to two or more layers and having a precoding applied to the two or more layers for reception from the two or more antenna ports;
receive information on a physical broadcast channel (PBCH) from at least the two or more logical antenna ports of the base station from which the SSS is transmitted; and
demodulate the information received on the PBCH based on the SSS received from the at least the two or more logical antenna ports.

20. The apparatus of claim 19, wherein the at least one processor is further configured to determine a channel estimate for each of the two or more logical antenna ports using the received SSS as a reference signal, and use determined channel estimates to demodulate the information received on the PBCH.

21. The apparatus of claim 19, wherein the at least one processor is further configured to:
   compute a detection metric for each of the two or more logical antenna ports from which the SSS is transmitted.

22. The apparatus of claim 21, wherein the detection metric for each of the two or more logical antenna ports is based at least in part on the received SSS.

23. The apparatus of claim 19, wherein the at least one processor is further configured to:
   receive a primary synchronization signal (PSS) from a logical antenna port at the base station; and
   demodulate the information received on the PBCH further based on the received PSS.

24. The apparatus of claim 19, wherein the at least one processor is further configured to:
   receive a demodulation reference signal for an additional one or more logical antenna ports used for transmitting the information on the PBCH, the additional one or more logical antenna ports being different from the two or more logical antenna ports.

\* \* \* \* \*